(12) United States Patent
Lee et al.

(10) Patent No.: US 12,274,153 B2
(45) Date of Patent: Apr. 8, 2025

(54) APPARATUS AND METHOD FOR MANUFACTURING DISPLAY DEVICE

(71) Applicant: Samsung Display Co., Ltd., Yongin-si (KR)

(72) Inventors: Jongsuk Lee, Yongin-si (KR); Kwanbae Kong, Yongin-si (KR); Woohyun Kwon, Yongin-si (KR); Juan Na, Yongin-si (KR); Yanghan Son, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 378 days.

(21) Appl. No.: 17/712,731

(22) Filed: Apr. 4, 2022

(65) Prior Publication Data
US 2023/0015869 A1 Jan. 19, 2023

(30) Foreign Application Priority Data

Jul. 19, 2021 (KR) .................. 10-2021-0094479

(51) Int. Cl.
| | | |
|---|---|---|
| *B32B 37/12* | (2006.01) | |
| *B32B 7/12* | (2006.01) | |
| *H10K 71/00* | (2023.01) | |
| *H10K 50/84* | (2023.01) | |
| *H10K 59/122* | (2023.01) | |
| *H10K 77/10* | (2023.01) | |
| *H10K 102/00* | (2023.01) | |

(52) U.S. Cl.
CPC .............. *H10K 71/00* (2023.02); *B32B 7/12* (2013.01); *B32B 37/12* (2013.01); *B32B 2457/20* (2013.01); *H10K 50/84* (2023.02); *H10K 59/122* (2023.02); *H10K 77/111* (2023.02); *H10K 2102/311* (2023.02)

(58) Field of Classification Search
CPC ...... H10K 71/00; H10K 50/84; H10K 59/122; H10K 77/111; H10K 2102/311; H10K 59/87; H10K 59/873; H10K 71/166; B32B 7/12; B32B 37/12; B32B 2457/20; B32B 38/1866; B32B 37/003; G06F 1/1626; H04M 1/0266; C23C 14/042; G09F 9/301

See application file for complete search history.

(56) References Cited

U.S. PATENT DOCUMENTS

2016/0236458 A1\* 8/2016 Kim ................ B32B 37/1292
2019/0329540 A1 10/2019 Samsung et al.

FOREIGN PATENT DOCUMENTS

| KR | 10-1653597 | 9/2016 |
| KR | 10-2019-0124358 | 11/2019 |
| KR | 10-2021-0012698 | 2/2021 |

\* cited by examiner

*Primary Examiner* — Cynthia L Schaller
(74) *Attorney, Agent, or Firm* — KILE PARK REED & HOUTTEMAN PLLC

(57) ABSTRACT

An apparatus for manufacturing a display device. The apparatus according to an embodiment includes a seating portion on which a panel assembly is disposed, a jig to which a window is disposed, and a guide film disposed between the seating portion and the jig, wherein the guide film includes a film layer on which the panel assembly is disposed, and a mask disposed on the film layer to be apart from the panel assembly.

20 Claims, 17 Drawing Sheets

APPARATUS AND METHOD FOR MANUFACTURING DISPLAY DEVICE

CROSS-REFERENCE TO RELATED APPLICATION(S)

This application claims priority to and benefits of Korean Patent Application No. 10-2021-0094479 under 35 U.S.C. § 119, filed on Jul. 19, 2021 in the Korean Intellectual Property Office, the entire contents of which are incorporated herein by reference.

BACKGROUND

1. Technical Field

One or more embodiments relate to an apparatus and a method for manufacturing a display device.

2. Description of the Related Art

Recently, the use of electronic devices has diversified and expanded. Electronic devices have been used in various ways, such as mobile electronic devices and fixed electronic devices. These electronic devices may include a display device capable of providing visual information such as images or videos to a user in order to support various functions.

Recently, as sizes of components for driving a display device have been reduced, a ratio of a display apparatus in an electronic device has gradually increased, and a display apparatus with a structure which may be foldable to a certain angle with respect to a flat state has been developed.

As more consumers value the design and ease of use of electronic devices, the designs of electronic devices have gradually diversified. Accordingly, display devices may include a curved portion in which sides may be bent or curved.

The above-mentioned background art is technical information possessed by the inventor for the derivation of the disclosure or acquired in the process of derivation of the disclosure, and is not necessarily said to be a known technique disclosed to the general public prior to the filing of the application.

SUMMARY

In a case of manufacturing a display device including a curved portion, there may be a problem in that, in a process of bonding the display panel and a window, an end of the curved portion may be pre-bonded to the window so that air bubbles may be formed between the display panel and the window.

One or more embodiments include an apparatus and method for manufacturing a display device, the apparatus and the method being capable of reducing quality defects by stably attaching a display panel and a window.

However, this problem and solution are merely examples, and the scope of the disclosure is not limited thereto.

Additional aspects will be set forth in part in the description that follows and, in part, will be apparent from the description, or may be learned by practice of the embodiments of the disclosure.

According to an embodiment, an apparatus for manufacturing a display device may include a seating portion on which a panel assembly may be disposed, a jig to which a window may be disposed, and a guide film disposed between the seating portion and the jig, wherein the guide film may include a film layer on which the panel assembly may be disposed, and a mask disposed on the film layer to be apart from the panel assembly.

The film layer may include a cavity accommodating the panel assembly, the cavity including an inner surface apart from an outer surface of the panel assembly.

The mask may be disposed on an outer surface of the film layer.

The film layer may include a first adhesive layer on which the panel assembly may be disposed, a first cover layer overlapping a surface of the first adhesive layer on which the panel assembly may be disposed, a second cover layer overlapping an opposite surface of the first adhesive layer, and a second adhesive layer apart from a side of the panel assembly and disposed on the first cover layer, the mask being disposed on the second adhesive layer.

The first adhesive layer may include a photoinitiator that reacts to an ultraviolet ray.

The second adhesive layer may not include a photoinitiator that reacts to an ultraviolet ray.

The mask may be provided in plural, each of the masks being apart from each other along a circumference of the panel assembly.

A hardness of the mask may be greater than a hardness of the film layer.

A first distance may be from a surface of the film layer on which the panel assembly may be disposed to a surface of the mask, a second distance may be from a surface of the film layer on which the panel assembly may be disposed to a surface of the panel assembly, and the first distance may be greater than the second distance.

A third distance may be between an outer surface of the mask and an outer surface of the panel assembly, and the first distance may be less than a sum of the third distance and the second distance.

The film layer may include a first adhesive layer on which the panel assembly may be disposed, and a second cover layer overlapping an opposite surface of a surface of the first adhesive layer on which the panel assembly may be disposed, and the mask may be apart from a side of the panel assembly and disposed on the first adhesive layer.

The mask may overlap the surface of the first adhesive layer on which the panel assembly may be disposed.

The mask may be disposed within the film layer.

The film layer may include cover layers, and adhesive layers between the cover layers, the panel assembly may be accommodated in one of the cover layers, so that the panel assembly may be disposed on one of the adhesive layers, and at least one of a remaining of the cover layers may include a mask in at least one area.

At least a portion of a circumference of the panel assembly may overlap the mask in a plan view.

The mask and a cover layer including the mask may have an ultraviolet light transmittance of about 40% or more, and an adhesive layer on which the panel assembly may be disposed may include a photoinitiator that reacts to an ultraviolet ray.

According to an embodiment, a method of manufacturing a display device may include preparing a window, preparing a guide film including a panel assembly arranged on a surface thereof, and a mask, and bonding the window and the panel assembly to each other by allowing the window and the guide film to be close to each other, the panel assembly being disposed on the guide film.

The bonding of the window and the panel assembly to each other may include allowing a portion of the panel assembly to be apart from the window.

The allowing of the portion of the panel assembly to be apart from the window may include allowing the mask to come into contact with the window before the portion of the panel assembly contacts the window.

The allowing of the portion of the panel assembly to be apart from the window may include supporting, by the mask, the portion of the panel assembly, and controlling bending of the portion of the panel assembly.

Other aspects, features, and advantages other than those described above will become apparent from the accompanying drawings, the appended claims, and the detailed description of the disclosure.

BRIEF DESCRIPTION OF THE DRAWINGS

The above and other aspects, features, and advantages of certain embodiments will be more apparent from the following description taken in conjunction with the accompanying drawings, in which.

DETAILED DESCRIPTION OF THE EMBODIMENTS

Figure 1:
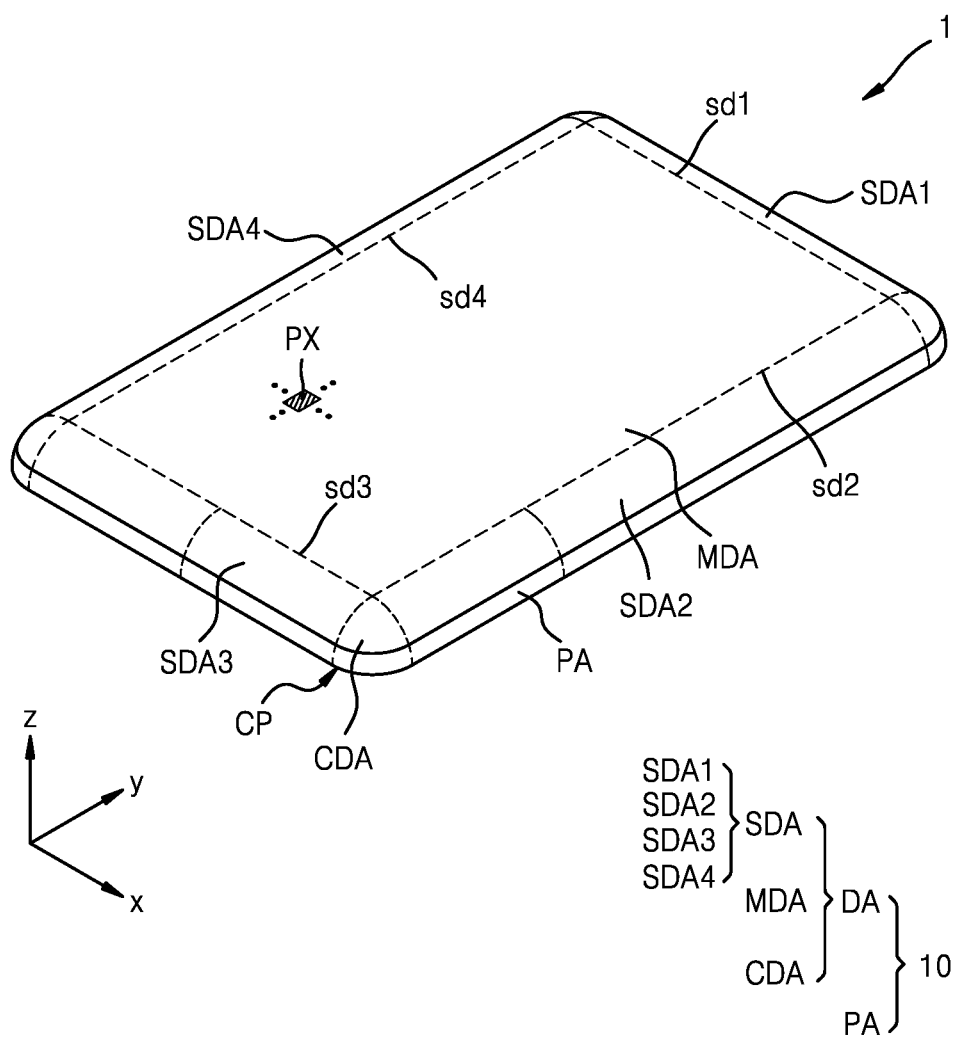
FIG. 1 is a perspective view schematically illustrating a display device which may be manufactured by an apparatus and/or method for manufacturing a display device, according to an embodiment.

Reference will now be made in detail to embodiments, examples of which are illustrated in the accompanying drawings, wherein like reference numerals refer to like elements throughout the disclosure. Advantages and features of the disclosure and methods of accomplishing the same may be understood more readily by reference thereto. The embodiments of the disclosure may have different forms and should not be construed as being limited to the descriptions set forth herein. Accordingly, the embodiments are merely described below, by referring to the figures, to explain aspects of the disclosure.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or." Throughout the disclosure, the expression "at least one of a, b and c" indicates only a, only b, only c, both a and b, both a and c, both b and c, all of a, b, and c, or variations thereof.

Terms such as "first" and "second" are used herein merely to describe a variety of elements, but the elements are not limited by the terms. Such terms are used only for the purpose of distinguishing one element from another element.

In an embodiment below, an expression used in the singular encompasses the expression of the plural (and vice versa), unless it has a clearly different meaning in the context.

It will be understood that the terms "comprise," "comprising," "has,", "having" "include," and/or "including" as used herein specify the presence of stated features or components but do not preclude the addition of one or more other features or components.

In an embodiment below, it will be understood that when a component, such as a layer, a film, a region, or a plate, is referred to as being "on" another component, the component can be directly on the other component or intervening components may be present thereon.

In the drawings, sizes of components in the drawings may be exaggerated or reduced for convenience of explanation. For example, since sizes and thicknesses of elements in the drawings may be arbitrarily illustrated for convenience of explanation, the disclosure is not limited thereto.

In the following embodiments, the x-axis, the y-axis, and the z-axis may not be limited to three axes of the rectangular coordinate system, and may be interpreted in a broader sense. For example, the x-axis, the y-axis, and the z-axis may be perpendicular to one another, or may represent different directions that may not be perpendicular to one another.

It will be understood that the terms "connected to" or "coupled to" may include a physical or electrical connection or coupling.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

When an embodiment may be implemented differently, a certain process order may be performed differently from the described order. For example, two consecutively described processes may be performed substantially at the same time or performed in an order opposite to the described order.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
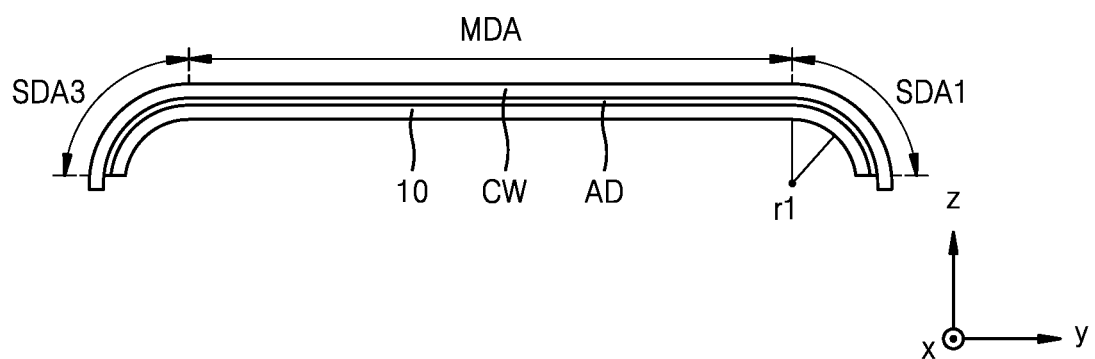
FIGS. 2 and 3 are cross-sectional views schematically illustrating a display device which may be manufactured by an apparatus and/or method for manufacturing a display device, according to an embodiment.
Figure 3:
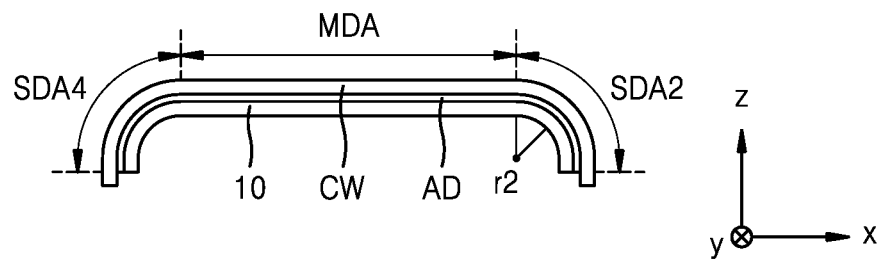

FIG. 1 is a perspective view schematically illustrating a display device 1 which may be manufactured by an apparatus and/or method for manufacturing a display device, according to an embodiment. FIGS. 2 and 3 are cross-sectional views schematically illustrating a display device which may be manufactured by an apparatus and/or method for manufacturing a display device, according to an embodiment.

Referring to FIGS. 1 to 3, the display device 1 may include an apparatus for displaying moving images or still images and may be used as a display screen of various products such as televisions, laptop computers, monitors, advertisement boards, and Internet of Things (IoT) devices, as well as portable electronic devices such as mobile phones, smartphones, tablet personal computers (PCs), mobile communication terminals, electronic notebooks, electronic books, portable multimedia players (PMPs), navigation devices, and ultra-mobile PCs (UMPCs). The display device 1 according to an embodiment may be used in wearable devices such as smart watches, watch phones, glasses-type displays, and head mounted displays (HMDs). The display device 1 may be used as instrument panels for automobiles, center fasciae for automobiles, or center information displays (CID) arranged (disposed) on a dashboard, room mirror displays that replace side-view mirrors of automobiles, and displays arranged on the backside of front seats as entertainment for back seats of automobiles.

In an embodiment, the display device 1 may include a long side in a first direction, and a short side in a second direction. The first direction and the second direction may include directions intersecting each other. For example, the first direction and the second direction may form an acute angle with each other. In another embodiment, the first direction and the second direction may form an obtuse angle or a right angle with each other. Hereinafter, a case where the first direction (for example, a y direction and a −y direction) and the second direction (for example, an x direction and a −x direction) may form a right angle with each other is described.

In another embodiment, in the display device 1, a length of a side in the first direction (for example, the y direction or the −y direction) may be a same as a length of a side in the second direction (for example, the x direction or the −x direction). In another embodiment, the display device 1 may have a short side in the first direction (for example, the y direction or the −y direction), and a long side in the second direction (for example, the x direction or the −x direction).

A corner on which the long side in the first direction (for example, the y direction or the −y direction) and the short side in the second direction (for example, the x direction or the −x direction) meet may be rounded to have a curvature.

Referring to FIGS. 2 and 3, the display device 1 may include a display panel 10 and a cover window CW. The cover window CW may protect the display panel 10.

The cover window CW may include a flexible window. The cover window CW may be readily bent in response to an external force without cracks or the like to protect the display panel 10. The cover window CW may include plastic or the like. The cover window CW may include, for example, ultra thin glass (UTG) and colorless polyimide (CPI). In an embodiment, the cover window CW may have a structure in which a flexible polymer layer may be arranged on a surface of a glass substrate, or may include only a polymer layer.

The display panel 10 may be arranged below the cover window CW. The display panel 10 may be attached to the cover window CW by an adhesive member AD. The adhesive member AD may include a transparent adhesive member such as an optically clear adhesive (OCA). The adhesive member AD may include various adhesive materials. The adhesive member AD may be provided (disposed) above the display panel 10 by various methods. For example, the adhesive member AD may be provided in the form of a film to be attached to an upper portion of the display panel 10 (for example, an upper portion of a thin-film encapsulation layer) or may be provided in the form of a material to be applied onto the display panel 10.

The display panel 10 may include a display area DA for displaying an image, and a peripheral area PA surrounding the display area DA. The display area DA may include pixels PX and an image may be displayed by the pixels PX. The pixels PX may each include sub-pixels. For example, the pixels PX may each include a red sub-pixel, a green sub-pixel, and a blue sub-pixel. In some embodiments, the pixels PX may each include a red sub-pixel, a green sub-pixel, a blue sub-pixel, and a white sub-pixel.

The display area DA may include a main display area MDA, an auxiliary display area SDA, and a corner display area CDA. The pixels PX arranged in each display area DA may display an image. In an embodiment, the pixels PX of the main display area MDA, the auxiliary display area SDA, and the corner display area CDA may each provide an independent image. In another embodiment, the pixels PX of the main display area MDA, the auxiliary display area SDA, and the corner display area CDA may each provide portions of an image.

The main display area MDA, which may be a flat display area, may include a pixel PX provided with a main display element. In an embodiment, the main display area MDA may provide the majority of the image.

The pixel PX provided with a display element may also be arranged in the auxiliary display area SDA. Thus, an image may be displayed in the auxiliary display area SDA. In an embodiment, the auxiliary display area SDA may include a first auxiliary display area SDA1, a second auxiliary display area SDA2, and a third auxiliary display area SDA3, and a fourth auxiliary display area SDA4. In some embodiments, at least one of the first auxiliary display area SDA1, the second auxiliary display area SDA2, the third auxiliary display area SDA3, and the fourth auxiliary display area SDA4 may be omitted.

The first auxiliary display area SDA1 and the third auxiliary display area SDA3 may be connected (extended) to the main display area MDA in a first direction (for example, the y direction or the −y direction). For example, the first auxiliary display area SDA1 may be connected to the main display area MDA in the +y direction, and the third auxiliary display area SDA3 may be connected to the main display area MDA in the −y direction. The first auxiliary display area SDA1 may be connected to a first side sd1 of the main display area MDA, and the third auxiliary display area SDA3 may be connected to a third side sd3 of the main display area MDA.

The first auxiliary display area SDA1 and the third auxiliary display area SDA3 may be bent to an arbitrary radius of curvature. In an embodiment, the first auxiliary display area SDA1 and the third auxiliary display area SDA3 may have different curvature radii from each other. In another embodiment, a curvature radius of the first auxiliary display area SDA1 may have a same curvature radius as the third auxiliary display area SDA3. Hereinafter, a case in which the first auxiliary display area SDA1 and the third auxiliary display area SDA3 may have a same radius of curvature, a first curvature radius r1, is described. Because the first auxiliary display area SDA1 and the third auxiliary display area SDA3 may be the same as or similar to each other, the first auxiliary display area SDA1 is described.

The second auxiliary display area SDA2 and the fourth auxiliary display area SDA4 may be connected to the main display area MDA in a second direction (for example, the x direction or the −x direction). For example, the second auxiliary display area SDA2 may be connected to the main display area MDA in the +x direction, and the fourth auxiliary display area SDA4 may be connected to the main display area MDA in the −x direction.

The second auxiliary display area SDA2 and the fourth auxiliary display area SDA4 may be bent to an arbitrary radius of curvature. In an embodiment, the second auxiliary display area SDA2 and the fourth auxiliary display area SDA4 may have different curvature radii from each other. In another embodiment, a curvature radius of the second auxiliary display area SDA2 may be equal to a curvature radius of the fourth auxiliary display area SDA4. Hereinafter, a case in which the second auxiliary display area SDA2 and the fourth auxiliary display area SDA4 may have a same radius of curvature, a second curvature radius r2, is described. Because the second auxiliary display area SDA2 and the fourth auxiliary display area SDA4 may be the same as or similar to each other, the second auxiliary display area SDA2 is described.

In an embodiment, the first curvature radius r1 of the first auxiliary display area SDA1 may be different from the second curvature radius r2 of the second auxiliary display area SDA2. For example, the first curvature radius r1 may be less than the second curvature radius r2. In another example, the first curvature radius r1 may be greater than the second curvature radius r2. In another embodiment, the first curvature radius r1 of the first auxiliary display area SDA1 may be equal to the second curvature radius r2 of the second auxiliary display area SDA2. Hereinafter, a case in which the first curvature radius r1 may be greater than the second curvature radius r2 is described.

The corner display area CDA may be arranged at a corner of the main display area MDA and may be bent. In other words, the corner display area CDA may be arranged to correspond to a corner portion CP. The corner portion CP, which may include a corner of the display area DA, may include a portion at which a long side in the first direction (for example, the y direction or the −y direction) of the display area DA and a short side in the second direction (for example, the x direction or the −x direction) meet.

The corner display area CDA may be arranged between auxiliary display areas SDA that may be adjacent to each other. For example, the corner display area CDA may be arranged between the first auxiliary display area SDA1 and the second auxiliary display area SDA2. In some embodiments, the corner display area CDA may be arranged between the second auxiliary display area SDA2 and the third auxiliary display area SDA3, between the third auxiliary display area SDA3 and the fourth auxiliary display area SDA4, or between the fourth auxiliary display area SDA4 and the first auxiliary display area SDA1. Accordingly, the auxiliary display area SDA and the corner display area CDA may be arranged to surround the main display area MDA, and may each be bent to have any radius of curvature.

In case that the first curvature radius r1 of the first auxiliary display area SDA1 is different from the second curvature radius r2 of the second auxiliary display area SDA2, a curvature radius of the corner display area CDA may be gradually changed. In an embodiment, in case that the first curvature radius r1 of the first auxiliary display area SDA1 is greater than the second curvature radius r2 of the second auxiliary display area SDA2, a curvature radius of the corner display area CDA may gradually decrease in a direction to the second auxiliary display area SDA2 from the first auxiliary display area SDA1. For example, a third curvature radius of the corner display area CDA may be greater than the second curvature radius r2 and less than the first curvature radius r1.

In the embodiment, the display device 1 may display an image not only in the main display area MDA but also in the auxiliary display area SDA and the corner display area CDA. Thus, a proportion of the display area DA in the display device 1 may increase. The display device 1 may include the corner display area CDA which may be bent, and display an image, and thus, aesthetics may be improved.

Figure 4:
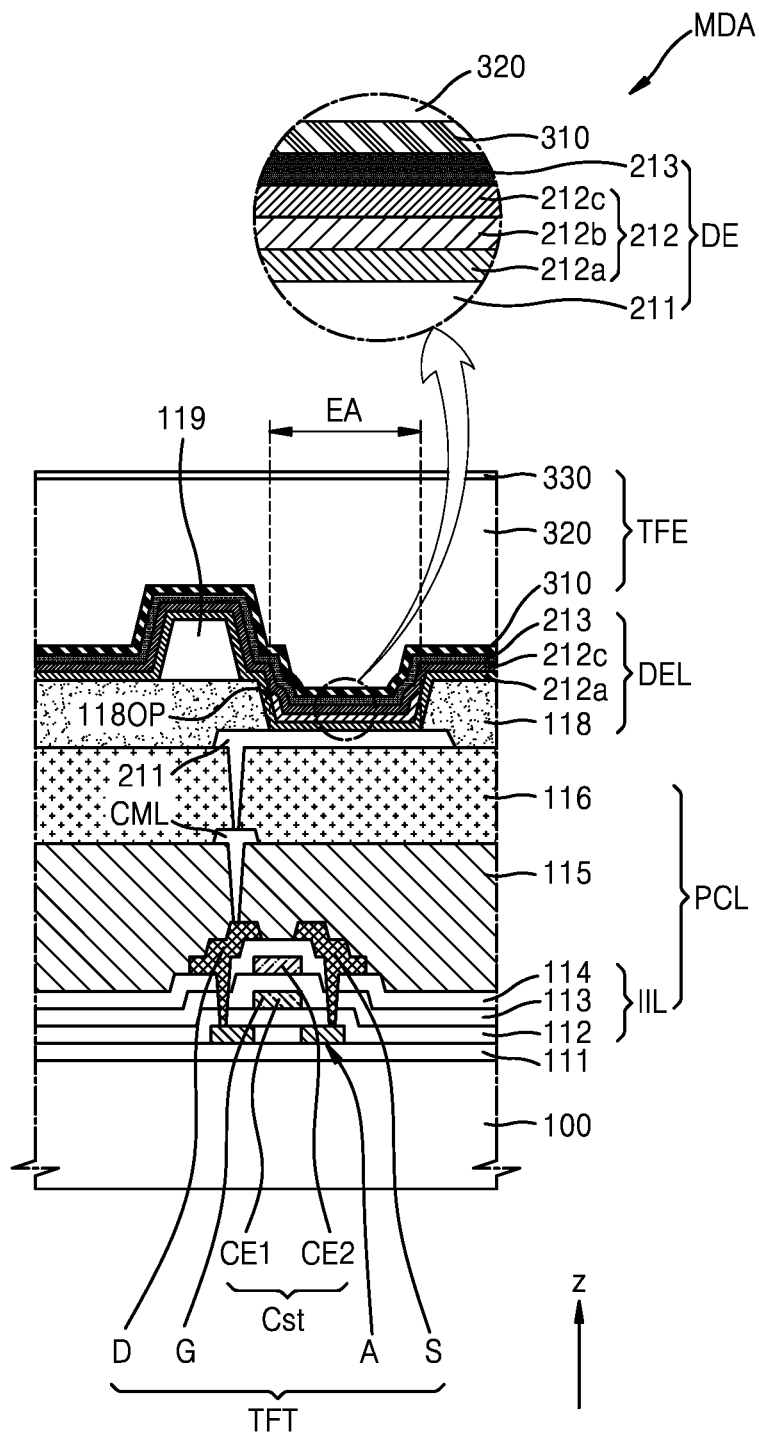
FIG. 4 is a cross-sectional view schematically illustrating a display panel of a display device, the display panel being manufactured by an apparatus and/or method for manufacturing a display device, according to an embodiment.

FIG. 4 is a cross-sectional view schematically illustrating a display panel of a display device 1 which may be manufactured by an apparatus and/or method for manufacturing a display device, according to an embodiment.

Referring to FIG. 4, the display device 1 may include a substrate 100, a buffer layer 111, a pixel circuit layer PCL, a display element layer DEL, and a thin-film encapsulation layer TFE.

The substrate 100 may include glass or polymer resin such as polyether sulfone, polyarylate, polyetherimide, polyethylene naphthalate, polyethylene terephthalate, polyphenylene sulfide, polyimide, polycarbonate, cellulose triacetate, cellulose acetate propionate, or a combination thereof. The substrate 100 including a polymer resin may be flexible, rollable, or bendable. The substrate 100 may have a multi-layer structure including a base layer and a barrier layer, the base layer including the polymer resin described above.

The buffer layer 111 may include an inorganic insulating material such as silicon nitride, silicon oxynitride, silicon oxide, or a combination thereof, and may have a single layer or multiple layers including the inorganic insulating materials described above.

The pixel circuit layer PCL may be arranged on the buffer layer 111. The pixel circuit layer PCL may include a thin-film transistor TFT included in a pixel circuit, an inorganic insulating layer IL arranged below and/or above elements of the thin-film transistor TFT, a first planarization layer 115, and a second planarization layer 116. The inorganic insulating layer IIL may include a first gate insulating layer 112, a second gate insulating layer 113, and an interlayer insulating layer 114.

The thin-film transistor TFT may include a semiconductor layer A, and the semiconductor layer A may include polysilicon. In some embodiments, the semiconductor layer A may include amorphous silicon, an oxide semiconductor, an organic semiconductor, or a combination thereof. The semiconductor layer A may include a channel area, a drain area, and a source area, the drain area and the source area being arranged at opposite sides of the channel area. A gate electrode G may overlap the channel area.

The gate electrode G may include a low-resistance metal material. The gate electrode G may include a conductive material including molybdenum (Mo), aluminum (Al), copper (Cu), titanium (Ti), or a combination thereof, and may include a single layer or multiple layers including the above materials.

The first gate insulating layer 112 between the semiconductor layer A and the gate electrode G may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide (ZnO), or a combination thereof.

The second gate insulating layer 113 may be provided to cover the gate electrode G. Similar to the first gate insulating layer 112, the second gate insulating layer 113 may include an inorganic insulating material such as $SiO_2$, $SiN_x$, SiON, $Al_2O_3$, $TiO_2$, $Ta_2O_5$, $HfO_2$, ZnO, or a combination thereof.

An upper electrode CE2 of a storage capacitor Cst may be arranged above the second gate insulating layer 113. The upper electrode CE2 may overlap the gate electrode G therebelow. The gate electrode G and the upper electrode CE2, which may overlap each other with the second gate insulating layer 113 therebetween, may be included in the storage capacitor Cst of the pixel circuit. In other words, the gate electrode G may function as a lower electrode CE1 of the storage capacitor Cst. As described above, the storage capacitor Cst and the thin-film transistor TFT may overlap each other. In some embodiments, the storage capacitor Cst may not overlap the thin-film transistor TFT.

The upper electrode CE2 may include Al, platinum (Pt), palladium (Pd), silver (Ag), magnesium (Mg), gold (Au), nickel (Ni), neodymium (Nd), iridium (Ir), chrome (Cr), calcium (Ca), Mo, Ti, tungsten (W), and/or Cu, and may include a single layer or multiple layers of the above-described materials.

The interlayer insulating layer 114 may cover the upper electrode CE2. The interlayer insulating layer 114 may include $SiO_2$, $SiN_x$, SiON, $Al_2O_3$, $TiO_2$, $Ta_2O_5$, $HfO_2$, ZnO, or a combination thereof. The interlayer insulating layer 114 may have a single layer or multiple layers including the above-described inorganic insulating materials. A drain electrode D and a source electrode S may be above the interlayer insulating layer 114. The drain electrode D and the source electrode S may each include a material having good conductivity. The drain electrode D and the source electrode S may each include a conductive material including Mo, Al, Cu, Ti, or a combination thereof, and may each include multiple layers or a single layer including the materials described above. In an embodiment, each of the drain electrode D and the source electrode S may have a multi-layer structure of a Ti layer, an Al layer, and another Ti layer.

The first planarization layer 115 may be arranged to cover the drain electrode D and the source electrode S. The first planarization layer 115 may include an organic insulating layer. The first planarization layer 115 may include an organic insulating material such as a general-purpose polymer such as poly(methyl methacrylate) (PMMA) or poly- styrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, and any blends thereof.

A connection electrode CML may be arranged on the first planarization layer 115. The connection electrode CML may be connected to the drain electrode D or the source electrode S through a contact hole defined in the first planarization layer 115. The connection electrode CML may include a material having good conductivity. The connection electrode CML may include a conductive material including Mo, Al, Cu, Ti, or a combination thereof, and may include multiple layers or a single layer including the above-described materials. In an embodiment, the connection electrode CML may have a multi-layer structure of a Ti layer, an Al layer, and another Ti layer.

The second planarization layer 116 may be arranged to cover the connection electrode CML. The second planarization layer 116 may include an organic insulating material. The second planarization layer 116 may include an organic insulating material such as a general-purpose polymer such as poly(methyl methacrylate) (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, and any blends thereof.

The display element layer DEL may be arranged on the pixel circuit layer PCL. The display element layer DEL may include a display element DE. The display element DE may include an organic light-emitting diode (OLED). A pixel electrode 211 of the display element DE may be electrically connected to the connection electrode CML through a contact hole defined in the second planarization layer 116.

The pixel electrode 211 may include a conductive oxide such as indium tin oxide (ITO), indium zinc oxide (IZO), zinc oxide (ZnO), indium oxide ($In_2O_3$), indium gallium oxide (IGO), aluminum zinc oxide (AZO), or a combination thereof. In another embodiment, the pixel electrode 211 may include a reflective layer that includes Ag, Mg, Al, Pt, Pd, Au, Ni, Nd, Ir, Cr, and any compounds thereof. In another embodiment, the pixel electrode 211 may further include a layer including ITO, IZO, ZnO, $In_2O_3$, or a combination thereof, above or below the reflective layer described above.

A pixel-defining layer 118 having an opening 118OP that exposes a central portion of the pixel electrode 211 may be arranged on the pixel electrode 211. The pixel-defining layer 118 may include an organic insulating material and/or an inorganic insulating material. The opening 118OP may define an emission area EA of light emitted by the display element DE. For example, a width of the opening 118OP may correspond to a width of the emission area EA of the display element DE.

A spacer 119 may be arranged on the pixel-defining layer 118. In a method of manufacturing the display device, the spacer 119 may prevent damage to the substrate 100. A mask sheet may be used when a display panel is manufactured. The spacer 119 may prevent a defect in which a portion of the substrate 100 may be damaged or broken by the mask sheet in case that the mask sheet enters the opening 118OP of the pixel-defining layer 118 or may be in close contact with the pixel-defining layer 118 to deposit a deposition material on the substrate 100.

The spacer 119 may include an organic insulating material such as polyimide. In some embodiments, the spacer 119 may include an inorganic insulating material such as $SiN_x$ or $SiO_2$, or may include an organic insulating material and an inorganic insulating material.

In an embodiment, the spacer 119 may include a material different from that of the pixel-defining layer 118. In another embodiment, the spacer 119 may include a same material as the pixel-defining layer 118, in which case the pixel-defining layer 118 and the spacer 119 may be provided together in a mask process using a half-tone mask or the like.

An intermediate layer 212 may be arranged on the pixel-defining layer 118. The intermediate layer 212 may include an emission layer 212b in the opening 118OP of the pixel-defining layer 118. The emission layer 212b may include a polymer organic material or a low-molecular weight organic material that may emit light of a color.

A first functional layer 212a and a second functional layer 212c may be respectively arranged below and above the emission layer 212b. For example, the first functional layer 212a may include a hole transport layer (HTL) or may include an HTL and a hole injection layer (HIL). The second functional layer 212c, which may be an element arranged above the emission layer 212b, may be optional. The second functional layer 212c may include an electron transport layer (ETL) and/or an electron injection layer (EIL). Similar to an opposite electrode 213, which will be described later, the first functional layer 212a and/or the second functional layer 212c may be common layers provided to fully cover the substrate 100.

The opposite electrode 213 may include a conductive material having a low work function. For example, the opposite electrode 213 may include a (semi-)transparent layer including Ag, Mg, Al, Pt, Pd, Au, Ni, Nd, Ir, Cr, Li, Ca, or any alloys thereof. In some embodiments, the opposite electrode 213 may further include a layer including ITO, IZO, ZnO, $In_2O_3$, or a combination thereof, above the (semi-)transparent layer including the materials described above.

In some embodiments, a capping layer (not shown) may be further arranged above the opposite electrode 213. The capping layer may include lithium fluoride (LiF), an inorganic material, and/or an organic material.

The thin-film encapsulation layer TFE may be arranged above the opposite electrode 213. In an embodiment, the thin-film encapsulation layer TFE may include at least one inorganic encapsulation layer and at least one organic encapsulation layer, and FIG. 4 shows that the thin-film encapsulation layer TFE includes a first inorganic encapsulation layer 310, an organic encapsulation layer 320, and a second inorganic encapsulation layer 330 that may be sequentially stacked on each other.

The first inorganic encapsulation layer 310 and the second inorganic encapsulation layer 330 may each include at least one inorganic material from among $Al_2O_3$, $TiO_2$, $Ta_2O_5$, $HfO_2$, ZnO, $SiO_2$, $SiN_x$, and SiON. The organic encapsulation layer 320 may include a polymer-based material. The polymer-based material may include an acryl-based resin, an epoxy-based resin, polyimide, polyethylene, or a combination thereof. In an embodiment, the organic encapsulation layer 320 may include acrylate.

Although not shown, a touch electrode layer may be arranged above the thin-film encapsulation layer TFE, and an optical functional layer may be arranged above the touch electrode layer. The touch electrode layer may obtain coordinate information according to an external input, for example, a touch event. The optical functional layer may reduce reflectivity of light (e.g., external light) incident toward the display device and/or improve the color purity of light emitted from the display device. In an embodiment, the optical functional layer may include a retarder and/or a polarizer. A retarder may be of a film type or a liquid crystal coating type and may include a $\lambda/2$ retarder and/or a $\lambda/4$ retarder. The polarizer may include a film-type polarizer or a liquid crystal-type polarizer. The film-type polarizer may include a stretchable synthetic resin film, and the liquid crystal-type polarizer may include liquid crystals arranged in a certain arrangement. Each of the retarder and the polarizer may further include a protective film.

In another embodiment, the optical functional layer may include a black matrix and color filters. The color filters may be arranged considering the colors of light emitted by each of the pixels of the display device. Each of the color filters may include red, green, or blue pigment or dye. In some embodiments, each of the color filters may further include quantum dots in addition to the above-described pigment or dye. In some embodiments, some of the color filters may not include the above-described pigment or dye, but may include scattering particles such as $TiO_2$.

In another embodiment, the optical functional layer may include a destructive interference structure. The destructive interference structure may include a first reflective layer and a second reflective layer that may be arranged on different layers from each other. First reflected light and second reflected light respectively reflected by the first reflective layer and the second reflective layer may undergo destructive interference, thereby reducing external light reflectivity.

An adhesive member may be arranged between the touch electrode layer and the optical functional layer. In an embodiment, a general adhesive member may be employed. The adhesive member may include a pressure sensitive adhesive (PSA).

Figure 5:
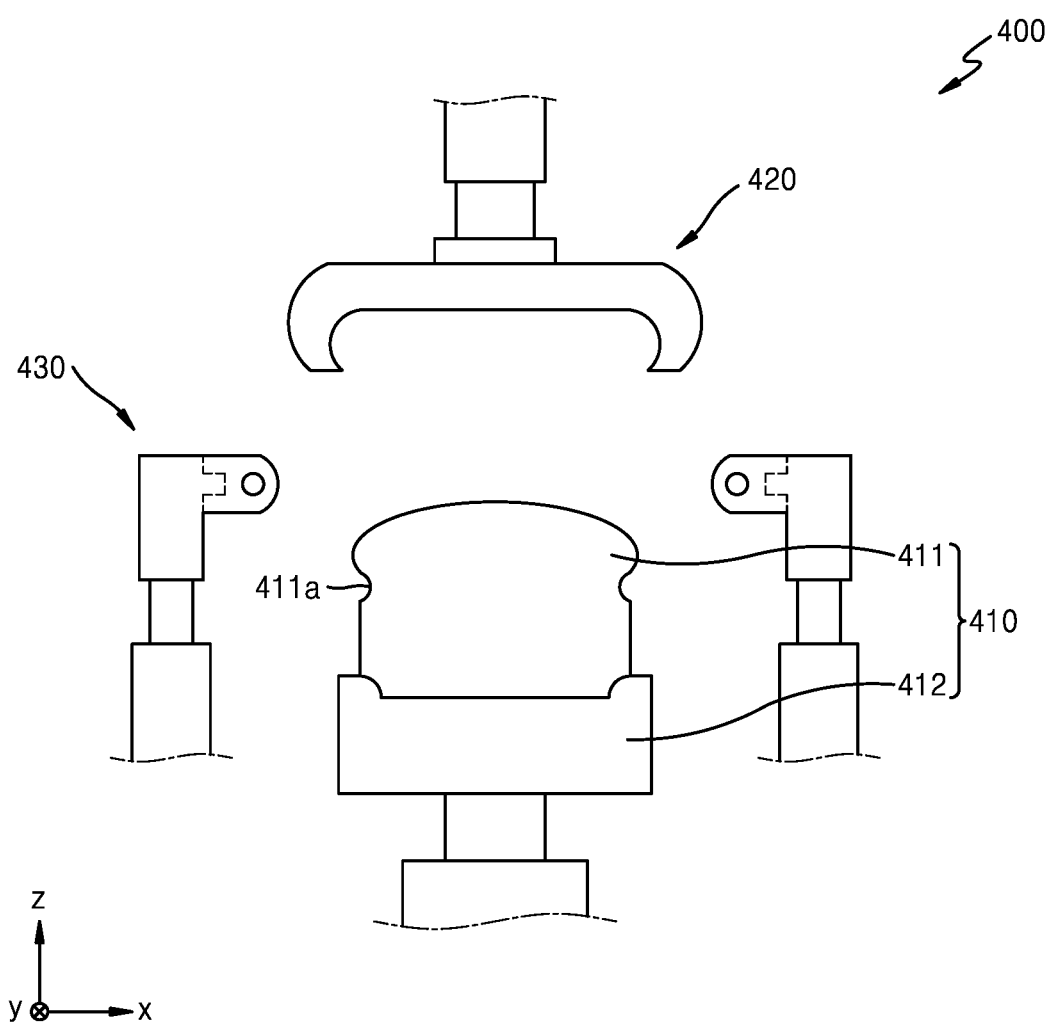
FIG. 5 is a cross-sectional view schematically illustrating an apparatus for manufacturing a display device, according to an embodiment.

FIG. 5 is a cross-sectional view schematically illustrating an apparatus, 400, for manufacturing a display device, according to an embodiment.

Referring to FIG. 5, the apparatus, 400, for manufacturing the display device may include a seating portion 410, a jig 420, and a push member 430.

The seating portion 410 may include a member on which a guide film 500, which will be described later, and a panel assembly 20 seated (disposed) thereon may be seated. In an embodiment, the seating portion 410 may operate by a lamination method using a pad. In case that the seating portion 410 includes a pad that includes an elastic material such as rubber, silicon, etc., a shape of the seating portion 410 may vary according to a force applied to the seating portion 410.

In another embodiment, the seating portion 410 may operate by a diaphragm lamination method. For example, the seating portion 410 may include a first pad portion 411 and a second pad portion 412. The first pad portion 411, which may be a portion in contact with the guide film 500, may include an air pump or may be connected to the air pump, and a passage through which air flows by the air pump may be provided in the first pad portion 411. The first pad portion 411 may have a low modulus, and a shape and volume thereof may vary according to the air pressure in case that the first pad portion 411 is pressurized through the air pump. The first pad portion 411 may include a diaphragm. Accordingly, the panel assembly 20 and the cover window CW may be bonded to each other by applying pressure through the first pad portion 411 while the jig 420 may be adjacent to the first pad portion 411.

The second pad portion 412 may include a jig for supporting the first pad portion 411, and the second pad portion 412 may be driven to allow the seating portion 410 to move up and down and/or left and right.

However, hereinafter, for convenience of explanation, a case in which the seating portion 410 includes a pad is described.

The first pad portion 411 may come into contact with the guide film 500 to pre-mold the guide film 500 along a portion of a shape of the first pad portion 411 or may support the guide film 500 and the panel assembly 20 seated thereon, to be coupled to the cover window CW attached to the jig 420.

In an embodiment, the first pad portion 411 may have elasticity in an area. In particular, a surface of the first pad portion 411, on which the guide film 500 may be seated, may include an elastic material. Accordingly, in case that the panel assembly 20 and the cover window CW may be respectively arranged on the first pad portion 411 and the jig 420 and a lamination process may be performed while applying pressure, the pressure may be distributed so that the panel assembly 20 and/or the cover window CW may be uniformly attached while preventing damage thereto.

For example, an upper end area and a side area of the first pad portion 411, for example, an area on which the guide film 500 may be seated, may include an elastic material, and remaining areas may include a material having relatively greater rigidity. For example, the upper end area and the side area of the first pad portion 411 may include at least one of a flexible and elastic material having elasticity, such as rubber or a flexible synthetic resin. The remaining areas may include at least one of plastic, reinforced plastic, and metal.

As described above, the first pad portion 411 may have different rigidity depending on an area. In other words, the upper end area and the side area of the first pad portion 411, which may be adjacent to the jig 420 and may vary depending on a shape of the cover window CW, may have relatively low rigidity, and the remaining areas that may support the above areas may have relatively greater rigidity. However, the example is not limited thereto, and for example, it may be understood that the entire first pad portion 411 may include a same material and may have a same rigidity.

In an embodiment, the first pad portion 411 may include a convex curved surface. For example, a surface of the first pad portion 411, for example, a surface on which the guide film 500 may be seated, may include a convex curved surface. Accordingly, as the first pad portion 411 moves to be adjacent to the jig 420, the first pad portion 411 may be pressed by the jig 420 from a convexly protruding portion, and the panel assembly 20 and the cover window CW may be bonded to each other from a center of the first pad 411.

In an embodiment, the first pad portion 411 may include a groove portion 411a. The groove portion 411a may be apart from a surface of the first pad portion 411, for example, a surface on which the guide film 500 may be seated, by a distance and arranged along an outer perimeter of the first pad portion 411. The push member 430, which will be described later, may move to come into contact with the groove portion 411a.

The second pad portion 412 may support the first pad portion 411, and may include, for example, a material having relatively greater rigidity than that of the first pad portion 411. The second pad portion 412 may be combined with the first pad portion 411 so as to move integrally with the first pad portion 411. In an embodiment, the second pad portion 412 may include a driving unit to move up and down and/or left and right. The driving unit, which allows the second pad portion 412 to move, may include, for example, an actuator or motor, and a gear, but is not limited thereto, and may include various means for allowing the second pad portion 412 to move.

The push member 430 may fix the guide film 500, and allow the guide film 500 to move so as to be seated on the seating portion 410. In an embodiment, multiple push members 430 may be arranged. In FIG. 5, two push members 430 are provided, but a number of the push members 430 is not limited thereto. For example, four or six push members 430 may be apart from each other along a perimeter of the seating portion 410.

The push member 430 may include a fixing member to fix the guide film 500. Multiple push members 430 may be arranged at a same height (for example, displacement in a same z direction) along the perimeter of the seating portion 410 to flatly fix the guide film 500.

The push member 430 may include a driving unit so as to move up and down and/or left and right. The driving unit may include, for example, an actuator or a motor, but is not limited thereto, and may include various means for allowing the push member 430 to move. In case that the multiple push members 430 are arranged, each of the push members 430 may simultaneously move. The push members 430 may move up and down and/or left and right while maintaining a same height (for example, displacement in a same y direction). Accordingly, the push member 430 may move to be adjacent to or in contact with the groove portion 411a of the first pad portion 411. A side of the push member 430, for example, a side in contact with the groove portion 411a, may include a curved surface. The curved surface may be provided to correspond to a shape of the groove portion 411a so as to readily contact the groove portion 411a.

The jig 420, which includes a member on which the cover window CW may be arranged, may be arranged to face the seating portion 410. In an embodiment, a concave space for accommodating the cover window CW may be provided on a surface of the jig 420, for example, a surface facing the seating portion 410. The cover window CW, for example, the cover window CW having a curved perimeter, may be arranged in the concave space. An inner perimeter of the concave space may be curved to correspond to the shape of the cover window CW.

The cover window CW may be detachably fixed to the jig 420. In an embodiment, the jig 420 may include a fixing member for fixing the cover window CW. For example, the fixing member may include a suction portion, such as a suction pump, that sucks air to prevent the cover window CW from being separated. In some embodiments, the fixing member may include an adhesive portion having an adhesive force, and in addition, various means for fixing the cover window CW may be used.

In an embodiment, the jig 420, which includes a driving unit, may move up and down and/or left and right. The driving unit allowing the jig 420 to move may include, for example, an actuator or a motor, but is not limited thereto.

Figure 6A:
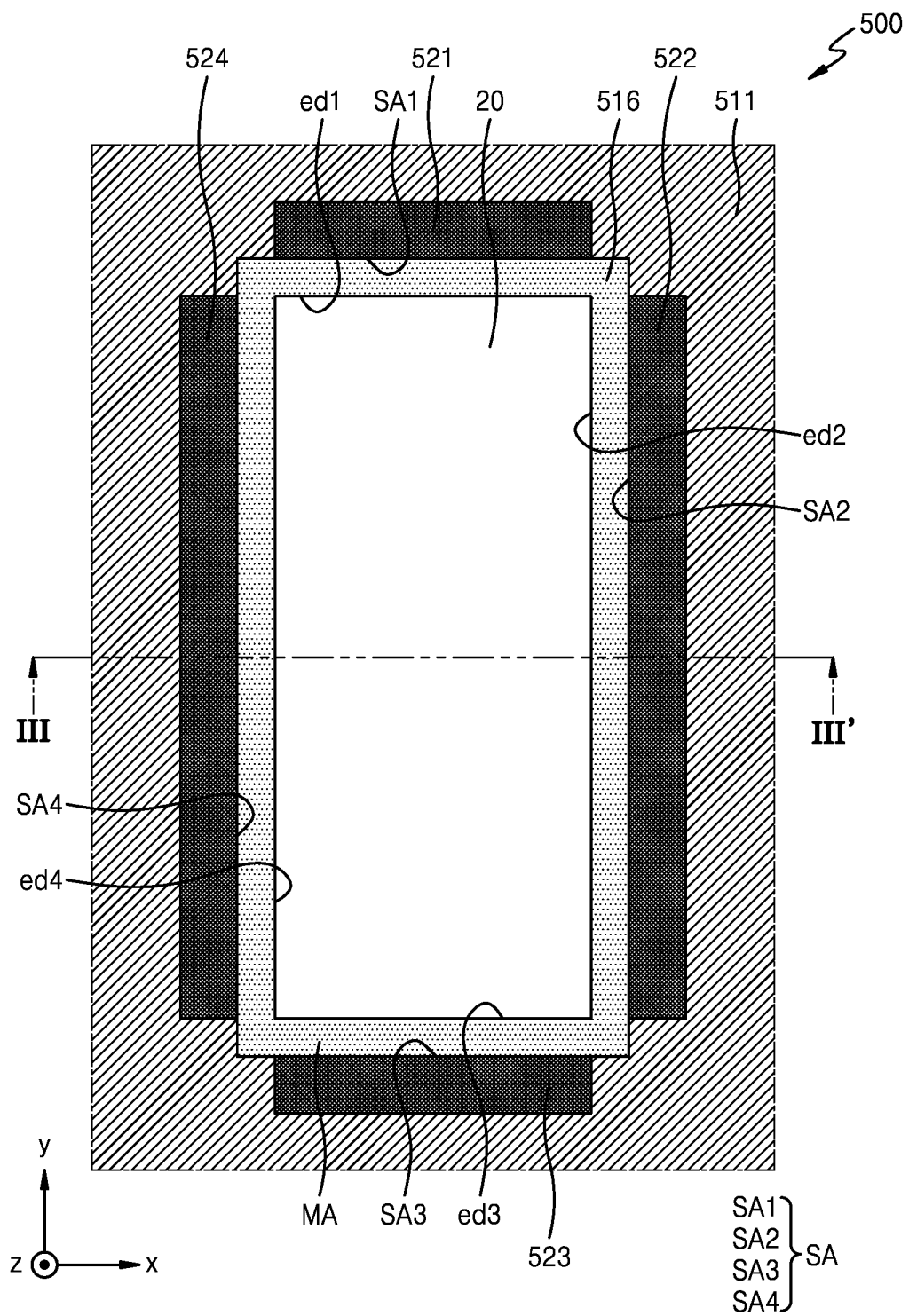
FIGS. 6A to 6F are views schematically illustrating a guide film according to an embodiment.
Figure 6B:
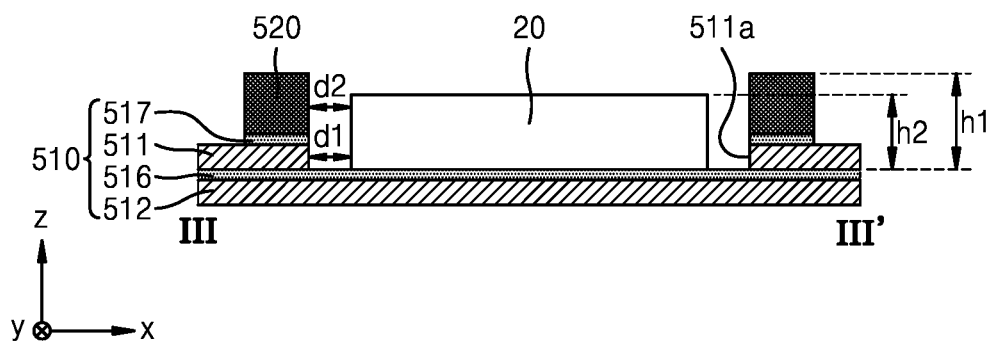

FIG. 6A is a plan view schematically illustrating a guide film on which a panel assembly is seated according to an embodiment, and FIG. 6B is a schematic cross-sectional view of the guide film in FIG. 6A taken along line III-III' in FIG. 6A.

Referring to FIGS. 6A and 6B, an apparatus, 400, for manufacturing a display device may further include a guide film 500.

The guide film 500 may include a member which may be bent together with the panel assembly 20 so that the panel assembly 20 attached thereto may be pre-molded into a shape conforming to the cover window CW. The panel assembly 20 refers to an assembly that includes the display panel 10 and the adhesive member AD for attaching the display panel 10 to the cover window CW. In other words, the panel assembly 20 refers to an assembly of all components from the display panel 10 to the adhesive member AD, including various elements that may be located between the display panel 10 and the adhesive member AD.

The panel assembly 20 may be seated on a surface of the guide film 500, for example, a surface facing the jig 420 and/or the cover window CW. In an embodiment, an adhesive layer may be arranged between the guide film 500 and the panel assembly 20, and the panel assembly 20 may be attached to the guide film 500 by the adhesive layer.

The guide film 500 may be provided to have a width greater than that of the panel assembly 20 in the first direction (for example, the x direction or the −x direction) and/or the second direction (for example, a y direction or a −y direction). In other words, a perimeter of the guide film 500 may be provided to be greater than that of the panel assembly 20 so that the panel assembly 20 may be accommodated in the guide film 500.

In an embodiment, the guide film 500 may include a main area MA in which the panel assembly 20 may be seated, and an auxiliary area SA adjacent thereto. The main area MA may correspond to a size of a cross-section on which the panel assembly 20 may be seated, and may have a same size. The auxiliary area SA may include a portion extending outwardly from the main area MA.

Multiple auxiliary areas SA may be provided. For example, the auxiliary area SA may include a first auxiliary area SA1 connected to a first edge ed1 of the main area MA, a second auxiliary area SA2 connected to a second edge ed2 of the main area MA, a third auxiliary area SA3 connected to a third edge ed3 of the main area MA, and a fourth auxiliary area SA4 connected to a fourth edge ed4 of the main area MA. The second edge ed2 may intersect the first edge ed1, the third edge ed3 may face the first edge ed1, and the fourth edge ed4 may face the second edge ed2.

The first auxiliary area SA1 to the fourth auxiliary area SA4 may each include an area overlapping an auxiliary area adjacent thereto. In other words, the first auxiliary area SA1 to the fourth auxiliary area SA4 may be physically distinguished from each other and separately formed, but the first auxiliary area SA1 to the fourth auxiliary area SA4 may be integrally connected to each other and may conceptually define that the first auxiliary area SA1 to the fourth auxiliary area SA4 may be portions of the auxiliary area SA that may be adjacent to the first edge ed1 to the fourth edge ed4. Hereinafter, a case in which the first auxiliary area SA1 to the fourth auxiliary area SA4 may be integrally provided as a single body is described.

The guide film 500 may include a film layer 510 and a mask 520 seated on the film layer 510. The film layer 510 may be included in a body of the guide film 500 and may be provided by stacking at least one cover layer and at least one adhesive layer. The cover layer may cover an externally exposed surface of the guide film 500, and the adhesive layer may be arranged on the cover layer to connect the cover layers or fix the panel assembly 20, the mask 520, etc.

Referring again to FIG. 6B, in an embodiment, the film layer 510 may include a first cover layer 511, a second cover layer 512, a first adhesive layer 516, and a second adhesive layer 517.

The first cover layer 511 may cover a surface of the guide film 500, for example, a surface facing the jig 420 and/or the cover window CW. The second cover layer 512 may cover a surface of the guide film 500, the surface facing the first cover layer 511, for example, a surface seated on the seating portion 410. In an embodiment, the first cover layer 511 and the second cover layer 512 may each include polyethylene terephthalate (PET).

In an embodiment, the first cover layer 511 may include a cavity 511a for accommodating the panel assembly 20. The cavity 511a may have a perimeter greater than that of the panel assembly 20 so as to accommodate the panel assembly 20. The panel assembly 20 may be provided apart by a distance d1 from a shape of the perimeter of the panel assembly 20. In other words, the cavity 511a may have an inner surface which may be apart by the distance d1 from an outer surface of the panel assembly 20. The distance d1 may include a tolerance for the panel assembly 20 to be attached to the first adhesive layer 516, which will be described later, through the cavity 511a of the first cover layer 511, and may be, for example, greater than or equal to about 10 μm and less than or equal to about 1000 μm. Accordingly, a shape of a perimeter of the cavity 511a may correspond to the shape of the perimeter of the panel assembly 20. For example, in case that the panel assembly 20 has a rectangular perimeter, the cavity 511a may also have a rectangular perimeter.

The first adhesive layer 516 may be between the first cover layer 511 and the second cover layer 512 so as to connect the first cover layer 511 and the second cover layer 512 to each other. The first adhesive layer 516 may include acryl, silicon, urethane, etc., or a combination thereof. As described above, the panel assembly 20 accommodated in the cavity 511a as well as the first cover layer 511 may be seated on a surface of the first adhesive layer 516. In other words, the first cover layer 511 and the panel assembly 20 may be seated on a same surface of the first adhesive layer 516. The first adhesive layer 516 may fix, for example, by attachment, the first cover layer 511 and the panel assembly 20 to each other.

As described above, the first cover layer 511 and the second cover layer 512 may be respectively arranged on a surface and a rear surface of the first adhesive layer 516 to cover the guide film 500. The first cover layer 511 may prevent the first adhesive layer 516 from being attached to the jig 420 or the like. The second cover layer 512 may prevent the first adhesive layer 516 from being attached to the seating portion 410 or the like.

The mask 520 may be arranged on the first cover layer 511. The mask 520 may be arranged on the first cover layer 511 to face the second cover layer 512 with respect to the first cover layer 511. The mask 520 may be in the form of a transparent sheet including at least one of PET, poly (methyl methacrylate) (PMMA), polycarbonate (PC), and cycloolefin polymer (COP).

The second adhesive layer 517 may be between the mask 520 and the first cover layer 511 to connect the mask 520 and the first cover layer 511 to each other. The second adhesive layer 517 may include acryl, silicon, urethane, etc., or a combination thereof.

In an embodiment, the mask 520 may be arranged to surround the panel assembly 20. In other words, the mask 520 may be arranged adjacent to the panel assembly 20 in the first auxiliary area SA1 to the fourth auxiliary area SA4. The mask 520 and the panel assembly 20 may be apart from each other by a distance d2. In an embodiment, the distance d2 by which the mask 520 and the panel assembly 20 may be apart from each other may be a same as the distance d1 by which the cavity 511a of the first cover layer 511 and the panel assembly 20 may be apart from each other. In other words, a surface of the mask 520, the surface being adjacent to the panel assembly 20, and an inner surface of the cavity 511a may be on a same plane.

A width of the mask 520 may be greater than or equal to about 10 μm and less than or equal to about 10,000 μm. A hardness of the mask 520 may be greater than that of the film layer 510, and thus the panel assembly 20 may be prevented from being pre-bonded to the cover window CW, but there may be a possibility that bending of the film layer 510 may be somewhat inhibited. Thus, a width of the mask 520 may be minimized so that bending of the film layer 510 may not be inhibited.

In an embodiment, a height of the mask 520 may be determined such that a first distance h1 from a surface on which the panel assembly 20 may be seated on the film layer 510 to a surface of the mask 520 may be greater than a second distance h2 from the surface on which the panel assembly 20 may be seated on the film layer 510 to a surface of the panel assembly 20. In other words, a sum h1 of heights of a first film layer 511, the second adhesive layer 517, and the mask 520 may be greater than a height h2 of the panel assembly 20. Accordingly, in case that the panel assembly 20 and the cover window CW are combined with each other, the mask 520 may come into contact with the cover window CW to prevent an edge of the panel assembly 20 from first contacting the cover window CW. In other words, in case that the panel assembly 20 is combined with the cover window CW, an edge of the panel assembly 20 may be prevented from being pre-bonded due to the adhesive member AD, such as an optically clear adhesive (OCA), arranged on an outer surface of the panel assembly 20.

The first distance h1 may be less than a sum of the second distance h2 and the distance d2 by which the mask 520 and the panel assembly 20 may be apart from each other. In a case in which the first distance h1 may be greater than the sum of the second distance h2 and the distance d2, in case that the panel assembly 20 and the cover window CW are bonded to each other, the edge of the panel assembly 20 may not come into contact with the cover window CW. This may cause a defect at an edge of the display device 1, and the defect in the display device 1 may be prevented by setting the first distance h1 as described above.

In an embodiment, multiple masks 520 may be arranged adjacent to the panel assembly 20. For example, the mask 520 may include a first mask 521 arranged in the first auxiliary area SA1, a second mask 522 arranged in the second auxiliary area SA2, a third mask 523 arranged in the third auxiliary area SA3, and a fourth mask 524 arranged in the fourth auxiliary area SA4. Each of the first, second, third, and fourth masks 521, 522, 523, and 524 may be arranged adjacent to the panel assembly 20 in each of the first, second, third, and fourth auxiliary areas SA1, SA2, SA3, and SA4, respectively, and may be apart from each other. For example, the first mask 521 to the fourth mask 524 may have a same length as the first edge ed1 to the fourth edge ed4, respectively. As described above, the first mask 521 to the fourth mask 524 may be respectively apart from the first edge ed1 to the fourth edge ed4 by the distance d2, and thus, the first mask 521 to the fourth mask 524 may be apart from each other instead of being connected to each other. This may prevent an interference between the masks 520 in case that the first auxiliary area SA1 to the fourth auxiliary area SA4 are bent, as will be described later.

However, the example is not limited thereto, and the first mask 521 to the fourth mask 524 may be partially connected to each other or may be integrally provided as a single body. Lengths of the first mask 521 to the fourth mask 524 may be all different from those of the first edge ed1 to the fourth edge ed4, or some of them may be different from each other. Hereinafter, for convenience of explanation, a case in which the first mask 521 to the fourth mask 524 may be provided apart from each other and lengths of the first mask 521 to the fourth mask 524 may be the same as those of the first edge ed1 to the fourth edge ed4 is described.

FIGS. 6C to 6F are views schematically illustrating the mask 520 according to an embodiment. FIGS. 6C to 6F show only the fourth auxiliary area SA4. The mask 520 of the first auxiliary area SA1 to the third auxiliary area SA3 may be arranged in a same or similar manner as/to that of the fourth auxiliary area SA4, and thus, hereinafter, the fourth auxiliary area SA4 is described.

Figure 6C:
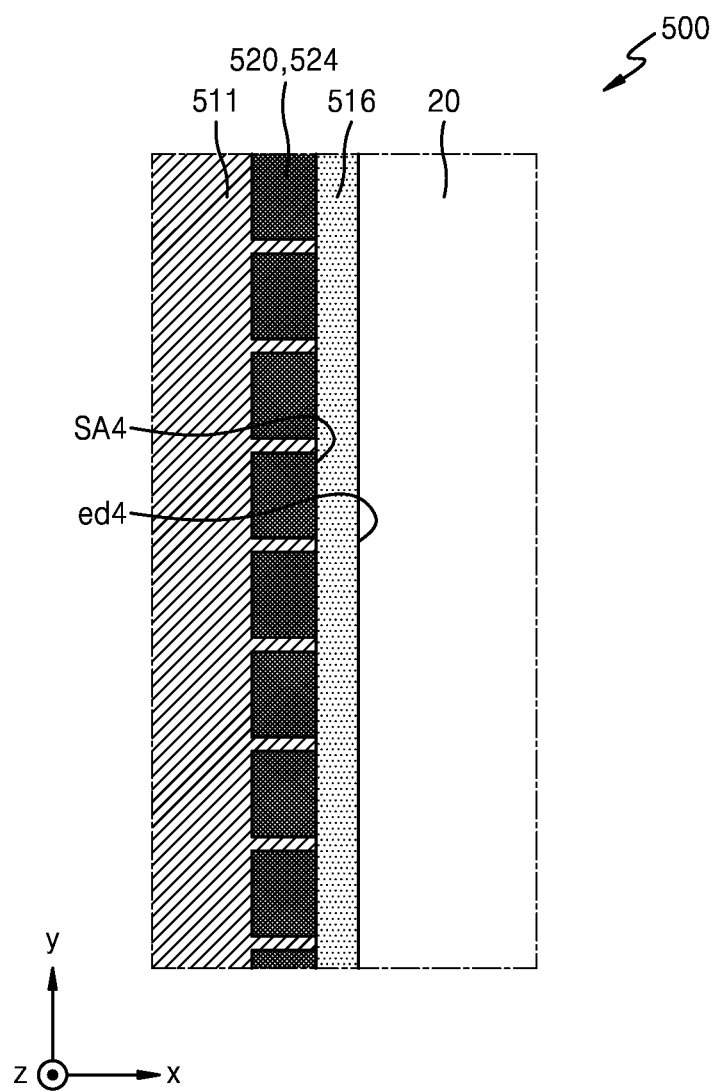

Referring to FIG. 6C, multiple fourth masks 524 may be apart from each other in a length direction (for example, a y direction in FIG. 6C). This may be advantageous for bending of the film layer 510 compared to a case where the fourth mask 524 may be provided in singularity.

Figure 6D:
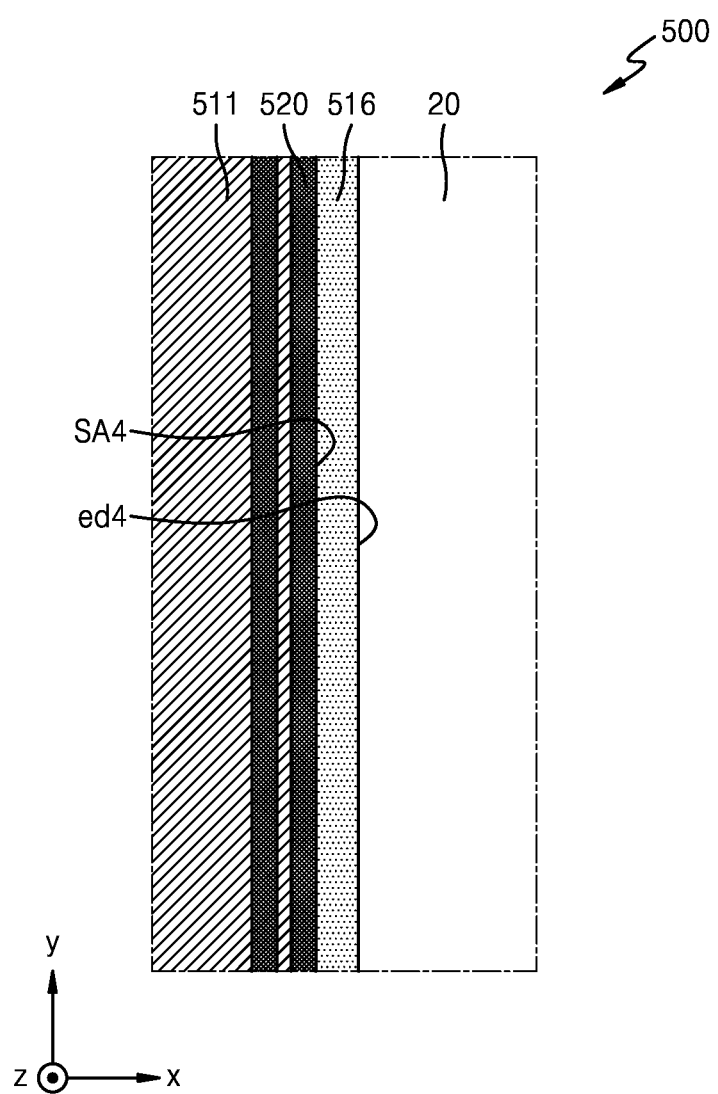

In some embodiments, as shown in FIG. 6D, fourth masks 524 may be apart from each other in a width direction (for example, an x direction in FIG. 6D). In FIG. 6D, two fourth masks 524 are provided in the width direction. However, the example is not limited thereto, and two or more fourth masks 524 may be provided.

Figure 6E:
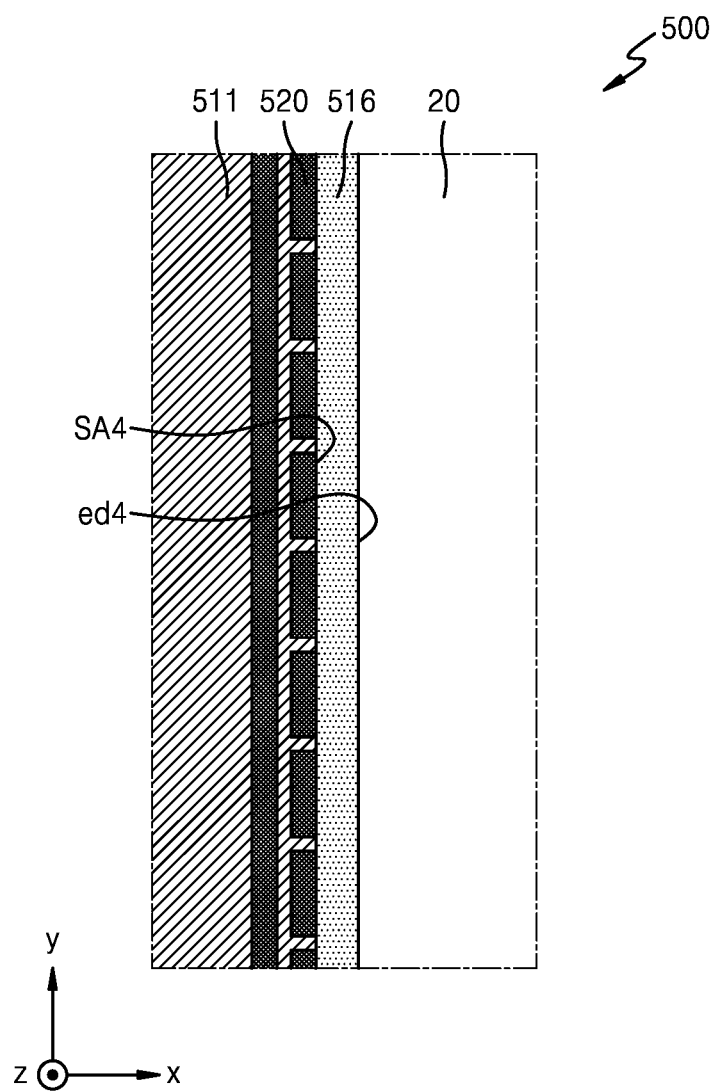
Figure 6F:
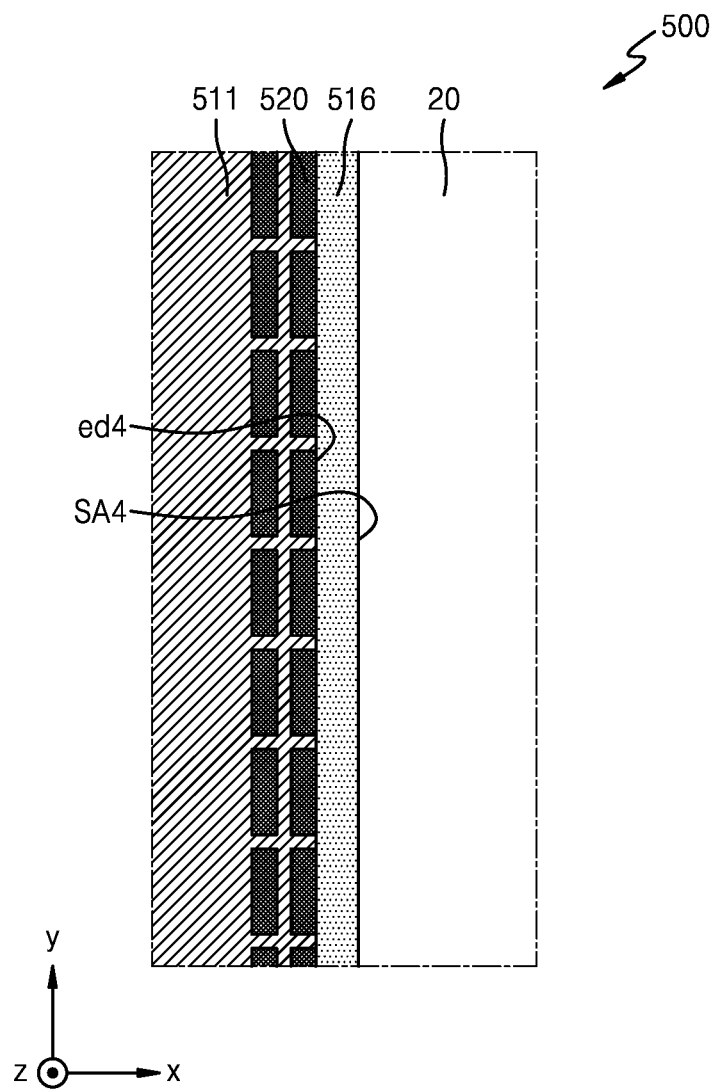

In some embodiments, as shown in FIG. 6E, the fourth mask 524 may be apart from each other in the width direction (for example, the x direction in FIG. 6E) and may include columns, and some of the columns may be integrally provided while other ones may be apart from each other in the length direction (For example, the y direction in FIG. 6E) and provided in multiple numbers. FIG. 6F illustrates an example in which each of the multiple columns may be apart from each other in the longitudinal direction (for example, a y direction in FIG. 6F).

Hereinabove, the fourth mask 524 of the fourth auxiliary area SA4 is described, but each of the first mask 521 to the third mask 523 may be arranged as described above. In other words, the example is not limited to a case in which the first mask 521 to the fourth mask 524 may be arranged in a same arrangement, and the first mask 521 to the fourth mask 524 may each select an appropriate arrangement considering characteristics of a bending area of the film layer 510.

Figure 7:
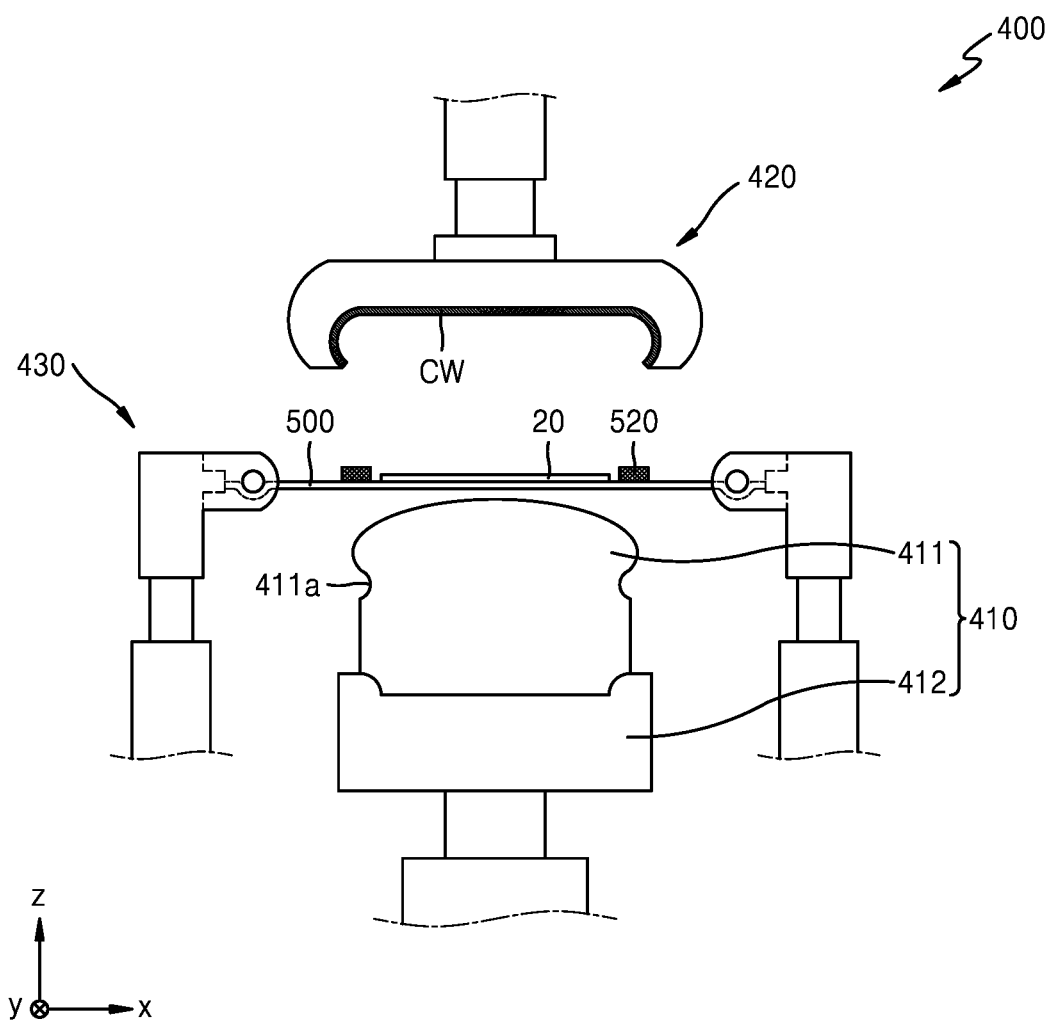
FIGS. 7 to 9 are cross-sectional views schematically illustrating an apparatus and method for manufacturing a display device, according to an embodiment.
Figure 8:
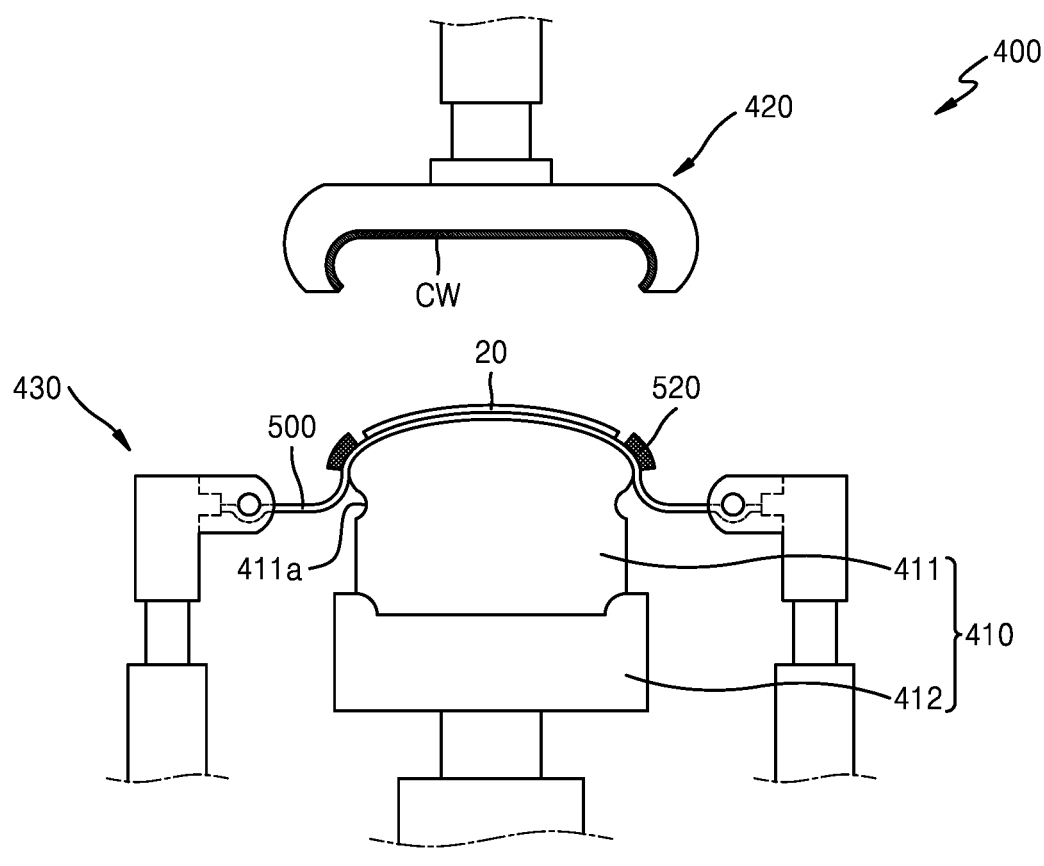
Figure 9:
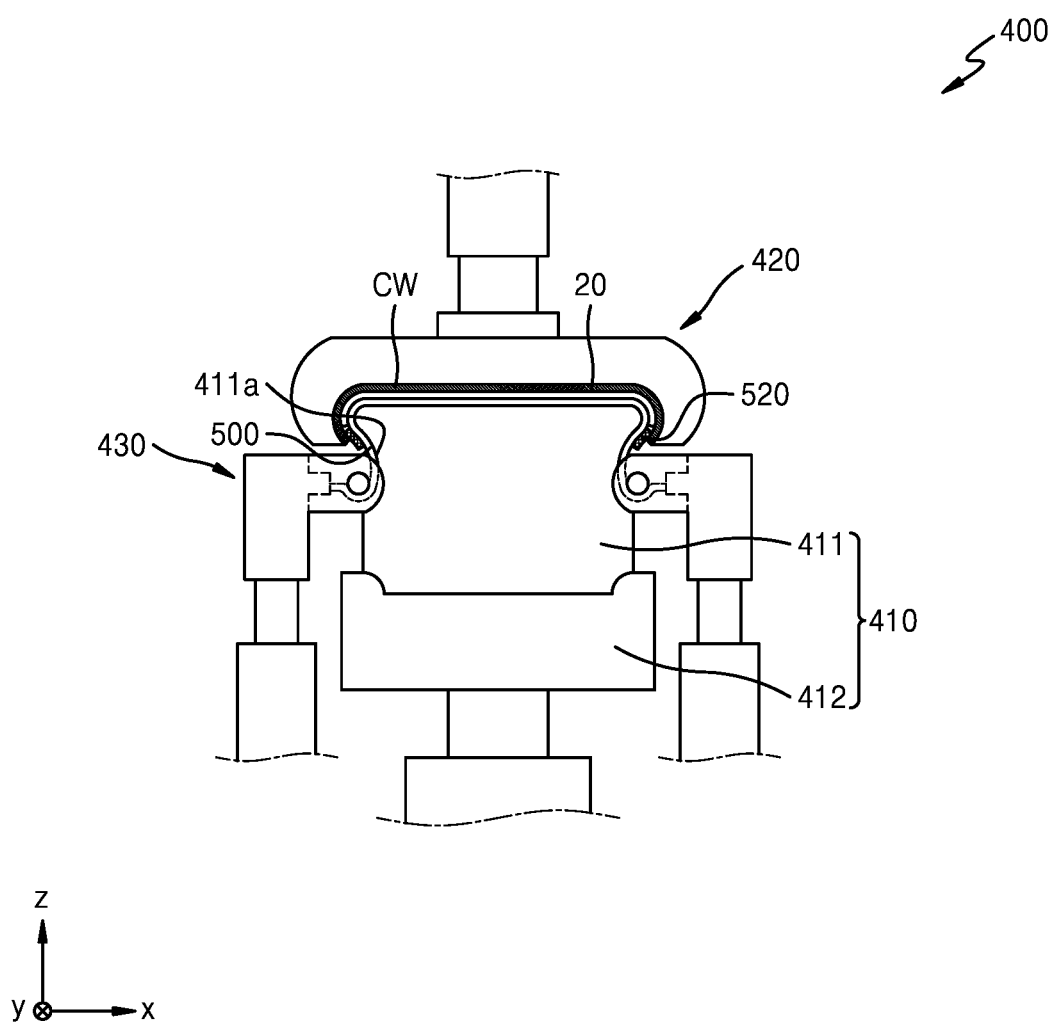

FIGS. 7 to 9 are cross-sectional views schematically illustrating an apparatus and method for manufacturing a display device, according to an embodiment.

Referring to FIG. 7, the guide film 500 on which the panel assembly 20 may be seated may be fixed to the push member 430. As described above, the adhesive member AD such as an OCA may be arranged on the outer surface of the panel assembly 20. The cover window CW may be arranged on the jig 420. In other words, the guide film 500 on which panel assembly 20 may be seated and the cover window CW may be arranged to face each other.

Referring to FIG. 8, the guide film 500 on which the panel assembly 20 may be seated may be seated on the first pad portion 411 of the seating portion 410. The guide film 500 may be bent along a convex curved surface of the first pad portion 411. For example, the push member 430 may move so as to be accommodated in the groove portion 411a, and the guide film 500 may be bent in close contact with the first pad portion 411 and pre-molded so as to be readily combined with the cover window CW.

Referring to FIG. 9, the seating portion 410 and the jig 420 may move close to each other so that the cover window CW and the panel assembly 20 may be bonded. The seating portion 410 and/or the jig 420 may move up and down using a driving unit, and the cover window CW may be bonded to the adhesive member AD of the panel assembly 20.

Figure 10A:
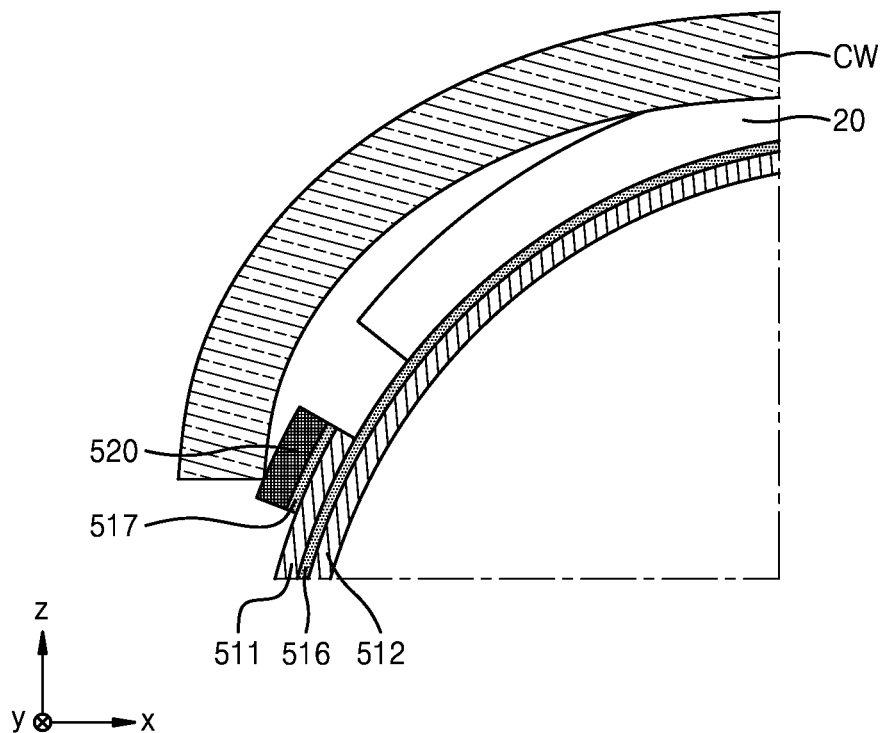
FIGS. 10A and 10B are cross-sectional views schematically illustrating a method of manufacturing a display device, according to an embodiment.
Figure 10B:
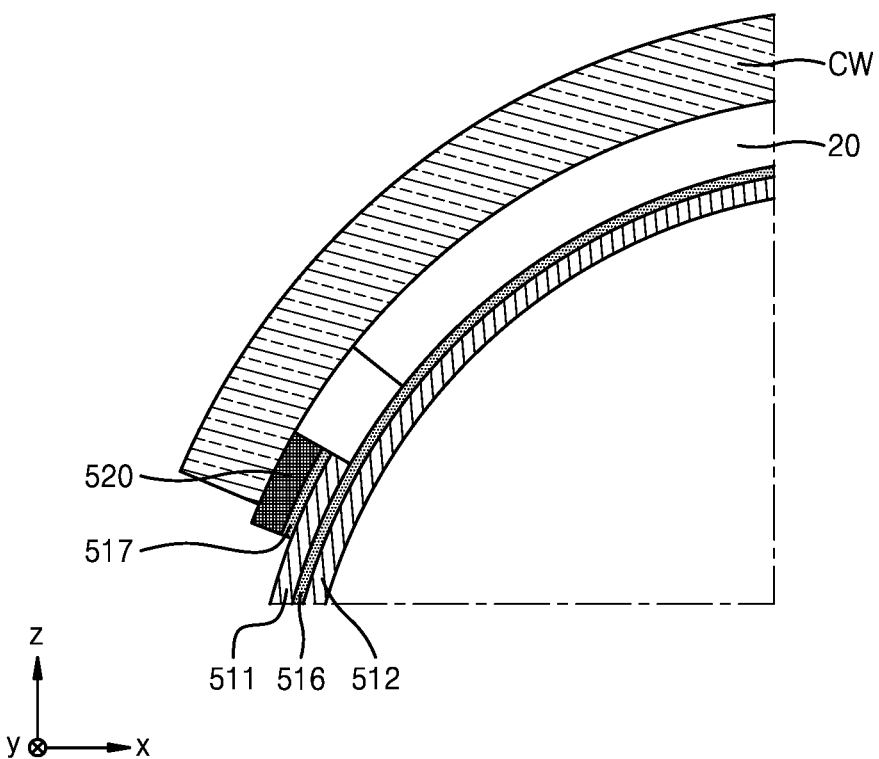

FIGS. 10A and 10B are enlarged cross-sectional views schematically illustrating a bonding process of the cover window CW and the panel assembly 20 shown in FIG. 9.

Referring to FIG. 10A, the seating portion 410 and/or the jig 420 may move, for example, in a z direction or a −z direction in FIG. 10A) so as to be close to each other. The guide film 500 and the panel assembly 20 that may be seated on the seating portion 410 may be pre-molded, and thus may come into contact with the cover window CW from a central area of the panel assembly 20. As the seating portion 410 and/or the jig 420 may be further pressed against each other, the seating portion 410 and/or the jig 420 may start to be sequentially bonded from the central area of the panel assembly 20 to a curved outer perimeter. The mask 520 first may contact a curved end of the cover window CW, thereby preventing the outer perimeter of the panel assembly 20 from being pre-bonded to the cover window CW. In other words, the mask 520 may come into contact with the curved end of the cover window CW to ensure a space between the cover window CW and the outer perimeter of the panel assembly 20.

Thereafter, as shown in FIG. 10B, as the seating portion 410 and the jig 420 further move toward each other, the cover window CW and the panel assembly 20 may be completely bonded to each other. Due to the space ensured between the cover window CW and the outer perimeter of the panel assembly 20, the outer perimeter of the panel assembly 20 may be prevented from being sequentially bonded to the cover window CW and from being pre-bonded. Thus, an air bubble layer provided on the display panel 10 may be prevented.

After the bonding of the cover window CW and the panel assembly 20 may be completed, the guide film 500 may be removed.

In an embodiment, the first adhesive layer 516 may include a photoinitiator. For example, the first adhesive layer 516 may be implemented with an ultraviolet adhesive sheet. This may allow the guide film 500 to be separated after the panel assembly 20 may be bonded to the cover window CW. In other words, after the panel assembly 20 may be bonded to the cover window CW, an ultraviolet ray may be irradiated in a direction, for example, a direction from a rear surface of a surface onto which the panel assembly 20 may be attached toward the surface onto which the panel assembly 20 may be attached. The photoinitiator may weaken an adhesive force of the first adhesive layer 516 due to the irradiated ultraviolet ray, and accordingly, the panel assembly 20 may be separated from the first adhesive layer 516, thus removing the guide film 500.

The second adhesive layer 517 may not include a photoinitiator. In case that the ultraviolet ray is irradiated as described above after the panel assembly 20 and the cover window CW may be bonded to each other, an adhesive force of the second adhesive layer 517 may not be weakened. The guide film 500 may be conveniently removed by maintaining, rather than separating, the mask 520 and the first cover 511 attached to each other by the second adhesive layer 517. However, the first cover layer 511 may be an ultraviolet blocking material. The second adhesive layer 517 may not include a photoinitiator, but an adhesive force may not be weakened even in case that the photoinitiator is included.

Figure 11:
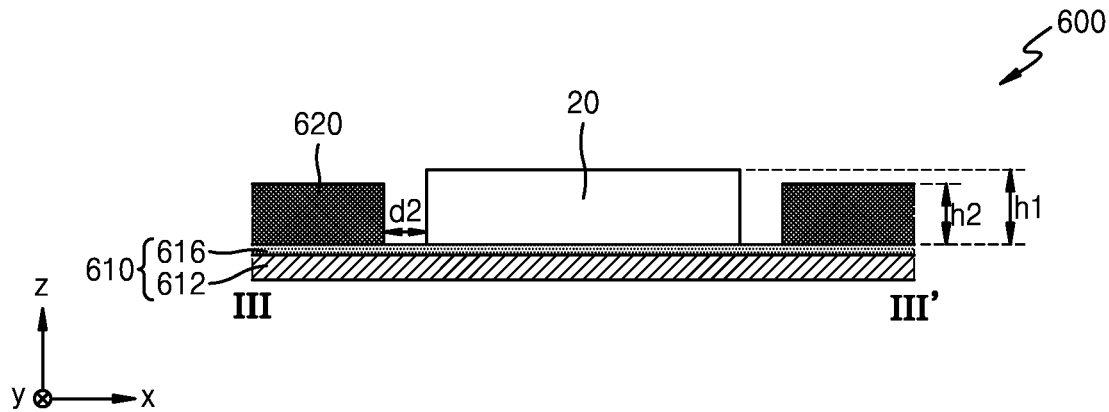
FIGS. 11 and 12 are cross-sectional views schematically illustrating a modified example of the guide film in FIG. 6A.
Figure 12:
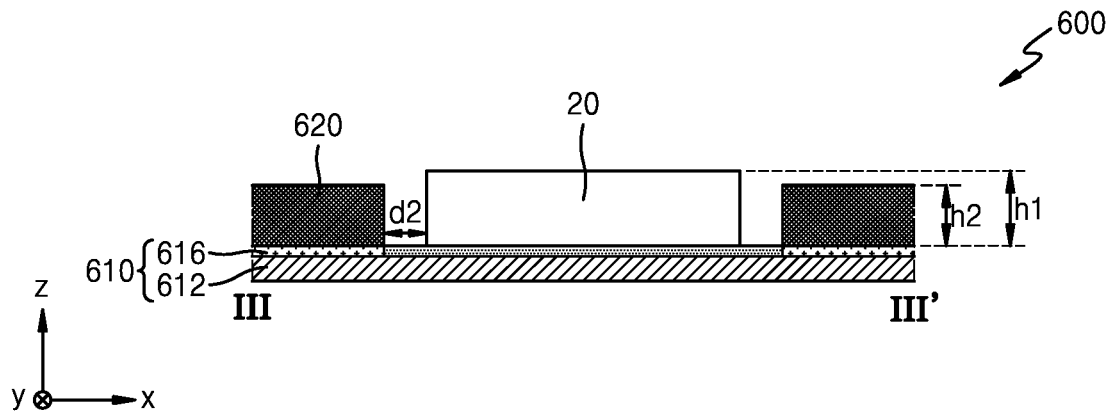

FIGS. 11 and 12 are cross-sectional views schematically illustrating a guide film 600 as a modified example of the guide film 500, according to an embodiment. The guide film 600 may be used in an apparatus, 400, and/or method for manufacturing the display device described above. The guide film 600 may be a modified example of the guide film 500, and redundant descriptions thereof may be omitted and differences may be described.

The guide film 600 may include a film layer 610 and a mask 620. The film layer 610 may include a first adhesive layer 616 on which the panel assembly 20 may be seated, and a second cover layer 612 covering an opposite surface of a surface of the first adhesive layer 616, the surface having the panel assembly 20 seated thereon.

In an embodiment, the mask 620 may cover the surface of the first adhesive layer 616 on which the panel assembly 20 may be seated. For example, the panel assembly 20 may be arranged on a surface of the first adhesive layer 616, and the mask 620 may cover remaining areas excluding areas in which the panel assembly 20 may be arranged. Thus, the first adhesive layer 616 may be prevented from being attached to the jig 420 or the like through the mask 620, without the need for arranging a first cover layer. The mask 620 may include PET. Accordingly, in case that the panel assembly 20 and the guide film 600 are pre-molded, the mask 620 which may be broadly arranged so as to cover the first adhesive layer 616 may be flexibly bent.

The mask 620 may be arranged to surround the panel assembly 20 as described above. In other words, the mask 620 may be arranged adjacent to the panel assembly 20 in the first auxiliary area SA1 to the fourth auxiliary area SA4. The mask 620 and the panel assembly 20 may be apart from each other by the distance d2.

A height of the mask 620 may be determined such that the first distance h1 from a surface of the film layer 610 on which the panel assembly 20 may be seated to a surface of the mask 620 may be greater than a second distance h2 from the surface of the film layer 610 on which the panel assembly 20 may be seated to a surface of the panel assembly 20. The first distance h1 may be the height of the mask 620. The first distance h1 may be less than a sum of the second distance h2 and the distance d2 by which the mask 520 and the panel assembly 20 may be apart from each other.

The first adhesive layer 616 may include a photoinitiator. For example, the first adhesive layer 616 may be implemented with an ultraviolet adhesive sheet. This may allow the guide film 600 to be separated after the panel assembly 20 may be bonded to the cover window CW. In other words, after the panel assembly 20 may be bonded to the cover window CW, an ultraviolet ray may be irradiated in a direction, for example, a direction from the rear surface of the surface to which the panel assembly 20 may be attached toward the surface to which the panel assembly 20 may be attached. The photoinitiator may weaken an adhesive force of the first adhesive layer 616 due to the irradiated ultraviolet ray, and accordingly, the panel assembly 20 may be separated from the first adhesive layer 616, thereby removing the guide film 600.

Referring to FIG. 12, in an embodiment, in the first adhesive layer 616, an adhesive characteristic of an area in which the panel assembly 20 may be seated may be different from that of an area in which the mask 620 may be seated. For example, the area in which the panel assembly 20 may be seated may include a photoinitiator, and the area in which the mask 620 may be seated may not include a photoinitiator. Accordingly, in case that an ultraviolet ray is irradiated after the panel assembly 20 and the cover window CW are bonded to each other, the panel assembly 20 may be separated from the first adhesive layer 616, but the mask 620 may not be separated from the first adhesive layer 616. This may maintain the mask 620 to be connected to the second cover layer 612 and conveniently remove the guide film 600. In FIG. 12, the first adhesive layer 616 area corresponding to the distance d2 by which the panel assembly 20 and the mask 620 may be apart from each other also includes a photoinitiator, but is not limited thereto, and the area may not include a photoinitiator.

Figure 13:
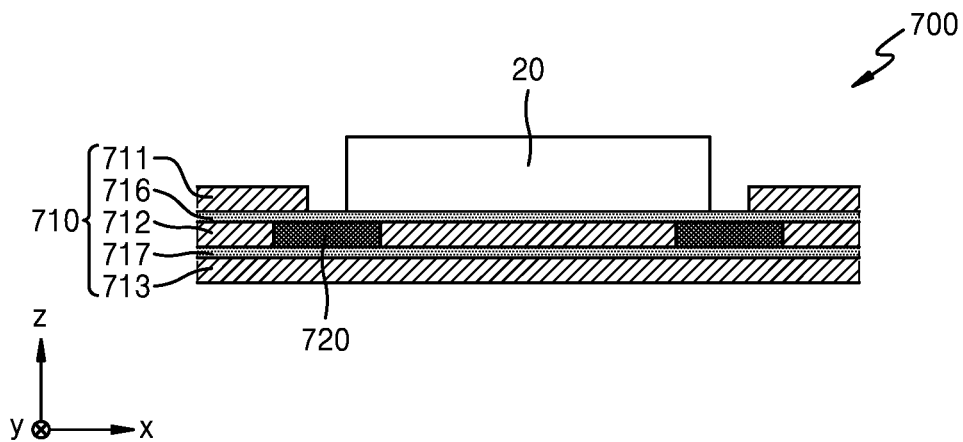
FIG. 13 is a cross-sectional view schematically illustrating a guide film according to another embodiment.

FIG. 13 is a cross-sectional view schematically illustrating a guide film 700 according to another embodiment.

The guide film 700 according to another embodiment is described below with reference to FIG. 13. Redundant descriptions thereof may be omitted, and differences may be described.

The guide film 700 may include a film layer 710 and a mask 720. The film layer 710 may be included in a body of the guide film 700 and may be formed by stacking at least one cover layer and at least one adhesive layer. The cover layer may cover an externally exposed surface of the guide film 700, and the adhesive layer may be arranged on the cover layer to connect the cover layers or fix the panel assembly 20, the mask 720, etc.

In an embodiment, the film layer 710 may include multiple adhesive layers between multiple cover layers. In FIG. 13, a first cover layer 711 to a third cover layer 713, and a first adhesive layer 716 and a second adhesive layer 717 between the first cover layer 711 to the third cover layer 713. However, the example is not limited thereto, and the cover layers and the adhesive layers may include more layers. Hereinafter, for convenience of explanation, the example of FIG. 13 is described as a reference.

In an embodiment, the mask 720 may be arranged within the film layer 710. For example, at least one of the cover layers, for example, the second cover layer 712, may have a space for accommodating the mask 720 therein, and the mask 720 may be arranged in the space. The second cover layer 712 and the mask 720 may have a same height (length in a z direction in FIG. 13). The mask 720 may be connected to the second cover layer 712 and integrally manufactured, but in some embodiments, the mask 720 may be separately manufactured from the second cover layer 712. The mask 720 may be arranged in the accommodation space of the second cover layer 712, and thus, the second cover layer 712 may prevent a step from occurring due to the mask 720 by using the second cover layer 712 even in case that the mask 720 may be arranged within the film layer 710.

The mask 720 may overlap at least a part of an external perimeter of the panel assembly 20 in a plan view in a direction (for example, a −z direction in FIG. 13). In other words, the mask 720 may support a part of the outer perimeter of the panel assembly 20. The mask 720 may have rigidity greater than those of the cover layers. For example, the mask 720 may be in the form of a transparent film including at least one of PMMA, PC, and COP.

The mask 720 may partially overlap an auxiliary display area of the panel assembly 20, that is, an area which may be bent to have a curvature, in a plan view in a direction (for example, the −z direction in FIG. 13). In other words, the mask 720 may extend in a direction (for example, the x direction or the −x direction in FIG. 13) from a point of the panel assembly 20 where the curvature ends, to support up to a portion of the first cover layer 711.

Thus, in case that the panel assembly 20 may be premolded to be bonded to the cover window CW, bending of an external perimeter of the panel assembly 20 may be suppressed by the mask 720.

Figure 14A:
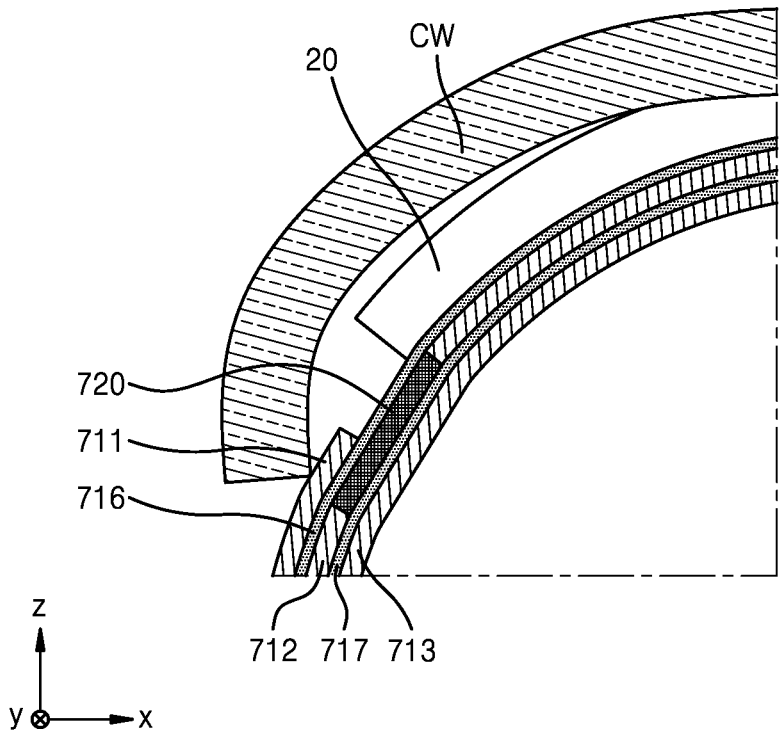
FIGS. 14A and 14B are cross-sectional views schematically illustrating a method of manufacturing a display device, according to another embodiment.
Figure 14B:
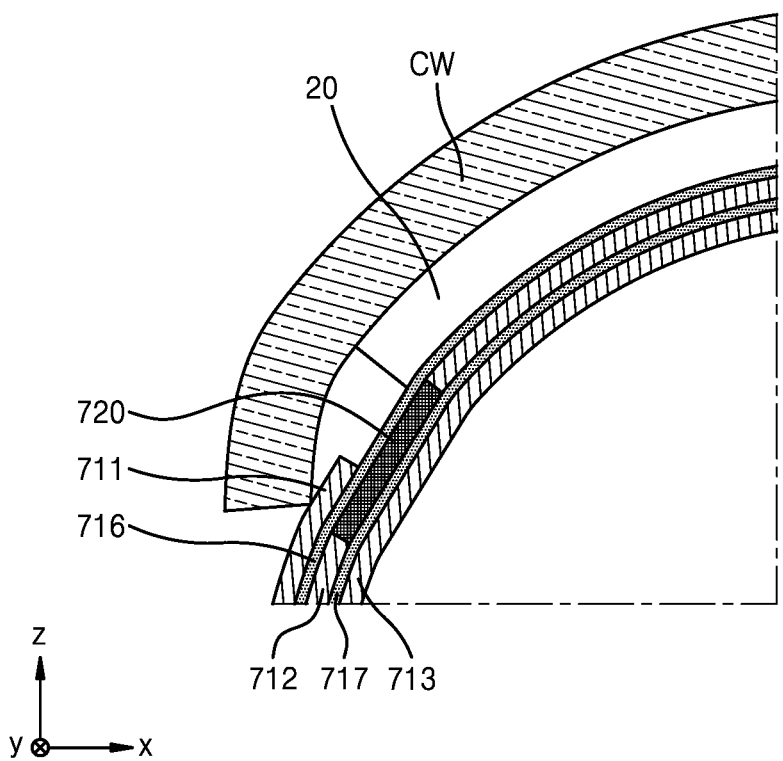

FIGS. 14A and 14B are enlarged cross-sectional views schematically illustrating a bonding process of the cover window CW and the panel assembly 20 shown in FIG. 9.

Referring to FIG. 14A, as described, or similar to the above, the seating portion 410 and/or the jig 420 may move so as to be adjacent to each other, for example, in the z direction or the −z direction in FIG. 14A. A bonding process of the cover window CW and the panel assembly 20 according to the above may be a same as or similar to the embodiment described above, and redundant descriptions thereof may be omitted.

The apparatus, 400, for manufacturing the display device according to an embodiment may be provided with the guide film 700 including the mask 720, thereby preventing the outer perimeter of the panel assembly 20 from being prebonded to the cover window CW. In other words, the mask 720 having rigidity greater than that of the film layer 710 may suppress bending of the outer perimeter of the panel assembly 20 to thereby ensure a space between the cover window CW and the outer perimeter of the panel assembly 20. Thus, the outer perimeter of the panel assembly 20 may be prevented from being excessively bent and from first contacting the cover window CW.

Thereafter, as shown in FIG. 14B, as the seating portion 410 and the jig 420 further move toward each other, the cover window CW and the panel assembly 20 may be completely bonded to each other. The space ensured between the cover window CW and the outer perimeter of the panel assembly 20 may prevent the outer perimeter of the panel assembly 20 from being pre-bonded to the cover window CW instead of being sequentially bonded. Thus, an air bubble layer may be prevented from being provided on the display panel 10.

As in the embodiment described above, after the bonding of the cover window CW and the panel assembly 20 may be completed, the guide film 700 may be removed.

In an embodiment, the first adhesive layer 716 may include a photoinitiator. For example, the first adhesive layer 716 may be implemented with an ultraviolet adhesive sheet. This may allow the guide film 700 to be separated after the panel assembly 20 may be bonded to the cover window CW. In other words, after the panel assembly 20 may be bonded to the cover window CW, an ultraviolet ray may be irradiated in a direction, for example, from a rear surface of the surface to which the panel assembly 20 may be attached, to the surface to which the panel assembly 20 may be attached. The photoinitiator may weaken an adhesive force of the first adhesive layer 716 due to the irradiated ultraviolet ray, and accordingly, the panel assembly 20 may be separated from the first adhesive layer 716 and the guide film 700 may be removed.

To this end, the second cover layer 712 and the mask 720 may have an ultraviolet light transmittance of about 40% or more. In order for an adhesive force of the first adhesive layer 716 to be weakened from an ultraviolet ray, the ultraviolet ray may be irradiated through the second cover layer 712 and the mask 720. As the ultraviolet light transmittance of the second cover layer 712 and the mask 720 may be high, the first adhesive layer 716 may readily receive the ultraviolet ray that passes through the second cover layer 712 and the mask 720, and separate the panel assembly 20.

Figure 15:
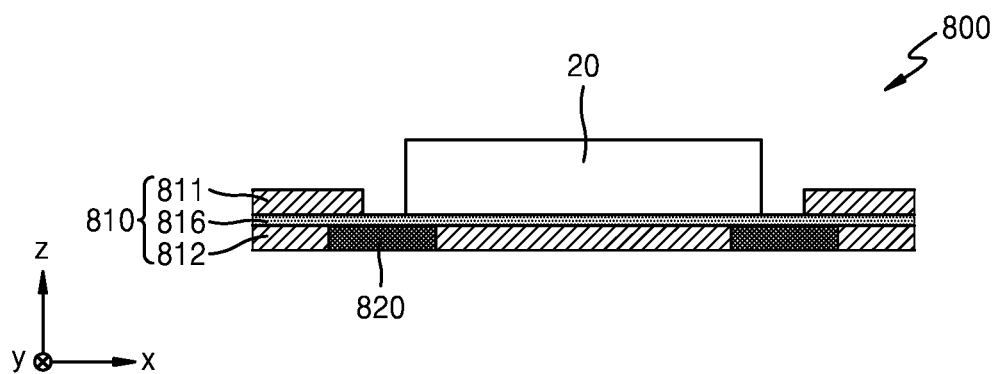
FIGS. 15 and 16 are cross-sectional views schematically illustrating modified examples of the guide film in FIG. 13.
Figure 16:
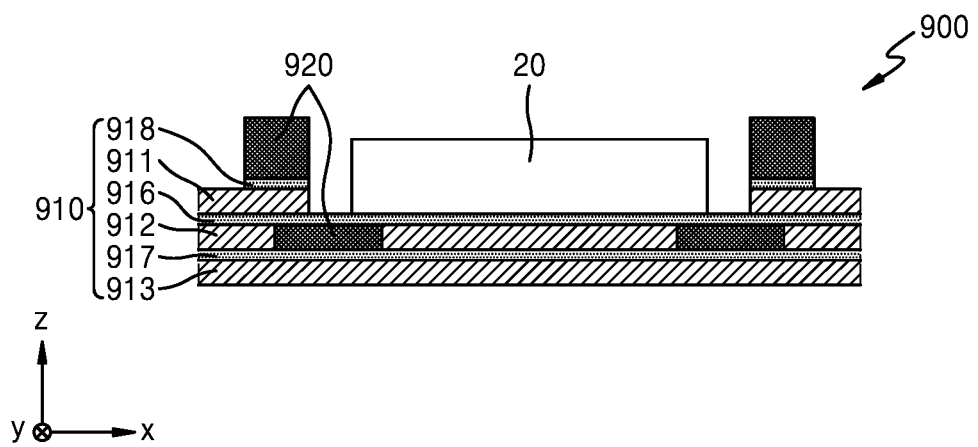

FIGS. 15 and 16 are cross-sectional views schematically illustrating guide films 800 and 900 as modified examples of the guide film 700, according to embodiments. The guide films 800 and 900 may be used in the apparatus, 400, and method for manufacturing the display device described above. The guide films 800 and 900 may be modified examples of the guide film 700, and redundant descriptions thereof may be omitted and differences may be described.

Referring to FIG. 15, the guide film 800 may include a film layer 810 and a mask 820. As shown in FIG. 15, the film layer 810 may include a first cover layer 811, a first adhesive layer 816, and a second cover layer 812.

As described above, the second cover layer 812 may have a space formed therein for accommodating the mask 820, and the mask 820 may be arranged in the space. The second cover layer 812 and the mask 820 may be connected to each other and integrally formed. The second cover layer 812 and the mask 820 may be connected to each other using various methods, such as an adhesive or mechanical bonding method. Accordingly, a third cover layer for preventing separation of the mask 820, and a second adhesive layer for attaching the third cover layer may not be necessary. The second cover layer 812 and the mask 820 may cover a surface of the first adhesive layer 816 and suppress bending of the outer perimeter of the panel assembly 20, thereby preventing the outer perimeter of the panel assembly 20 from first contacting the cover window CW.

Referring to FIG. 16, the guide film 900 may include a combination of the guide film 900 with the guide film 700. The guide film 900 may include a film layer 910 and a mask 920. The film layer 910 may include a first adhesive layer 916 on which the panel assembly 20 may be seated, a first cover layer 911 covering a surface of the film layer 910 on which the panel assembly 20 may be seated, a second cover layer 912, a second adhesive layer 917, and a third cover layer 913, which may be sequentially arranged from a rear surface of a surface, on which the panel assembly 20 may be seated, of the first adhesive layer 916.

Similar to the mask 520 of the guide film 500, the mask 920 may be arranged on the first cover layer 911. The second adhesive layer 918 may be between the mask 920 and the first cover layer 911 to connect the mask 920 and the first cover layer 911 to each other.

Similar to the mask 720 of the guide film 700, the mask 920 may also be arranged on the second cover layer 912. The second cover layer 912 may have a space formed therein for accommodating the mask 920, and the mask 920 may be arranged in the space.

The mask 920 described above may be the same as or similar to the masks 520 and 720 described above, and redundant descriptions thereof may be omitted.

As described above, in the guide film 900, the mask 920 arranged on the first cover layer 911 may first contact the cover window CW to prevent the outer perimeter of the panel assembly 20 from being pre-bonded to the cover window CW, and the mask 920 arranged on the second cover layer 912 may suppress excessive bending of the outer perimeter of the panel assembly 20 to prevent pre-bonding of the outer perimeter of the panel assembly 20.

An apparatus and method for manufacturing a display device according to an embodiment may include a guide film provided with a mask, to attach a display panel and a window in close contact with each other. Thus, a defect rate of the display device may decrease, and a yield may increase.

In the apparatus and method for manufacturing the display device according to an embodiment, a mask may be arranged on the outside of a film layer so that the mask comes into contact with an end portion of the window, and thus, a space between the display panel and the window may be ensured to prevent the display panel from being pre-bonded to the window.

According to an embodiment of an apparatus or a method for manufacturing a display device, a mask may be arranged within a film layer to support a display panel and suppress bending of the display panel, and thus, a space may be ensured between the display panel and a window so as to prevent the display panel from being pre-bonded to the window.

It should be understood that embodiments described herein should be considered in a descriptive sense only and not for purposes of limitation. Descriptions of features or aspects within each of the embodiments should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure.

What is claimed is:

1. An apparatus for manufacturing a display device, the apparatus comprising:
 a seating portion configured to support a panel assembly;
 a jig configured to support a window; and
 a guide film between the seating portion and the jig such that a first surface of the guide film faces the jig in a first direction and a second surface faces the seating portion in a second direction opposite the first direction,
 wherein the guide film comprises:
  a film layer comprising a region configured to support the panel assembly;
  a mask overlapping a portion of the film layer in a view in the second direction; and
  a cavity defining, at least in part, a terminal surface recessed from the first surface in the second direction, the region being a central portion of the terminal surface offset from a periphery of the cavity in a third direction perpendicular to both the first direction and the second direction.

2. The apparatus of claim 1, wherein the cavity extends in the second direction between inner surfaces of at least one of the film layer and the mask in the third direction.

3. The apparatus of claim 1, wherein a surface of the mask forms a portion of either the first surface or the second surface.

4. The apparatus of claim 3, wherein the film layer comprises:
 a first adhesive layer arranged and configured to detachably couple with the panel assembly;
 a first cover layer overlapping a first surface of the first adhesive layer in the first direction;
 a second cover layer overlapping a second surface of the first adhesive layer in the second direction; and
 a second adhesive layer disposed on the first cover layer and, in the view, is spaced apart from the region, the mask being disposed on the second adhesive layer such that the second adhesive layer is between the mask and the first cover layer in the first direction.

5. The apparatus of claim 4, wherein the first adhesive layer comprises a photoinitiator that reacts to an ultraviolet ray.

6. The apparatus of claim 4, wherein the second adhesive layer does not include a photoinitiator that reacts to an ultraviolet ray.

7. The apparatus of claim 1, wherein the mask is provided in plural, each of the masks spaced apart from each other along a periphery of the cavity.

8. The apparatus of claim 1, wherein, in a case that the panel assembly is at least partially supported in the cavity and on the region:
- a first distance is defined, in the first direction, from the terminal surface to a surface of the mask facing the jig in the first direction,
- a second distance is defined, in the first direction, from the terminal surface to a surface of the panel assembly facing the jig in the first direction, and
- the first distance is greater than the second distance.

9. The apparatus of claim 8, wherein, in the case that the panel assembly is at least partially supported in the cavity and on the region;
- a third distance is defined between an inner outer surface of the mask and an outer surface of the panel assembly in the third direction, the inner surface of the mask facing the outer surface of the panel assembly in the third direction, and
- the first distance is less than a sum of the third distance and the second distance.

10. The apparatus of claim 3, wherein
the film layer comprises:
- a first adhesive layer comprising a first surface arranged and configured to detachably couple with the panel assembly; and
- a cover layer facing a second surface of the first adhesive layer in the second direction, and
in the view, the mask is outside of the region and overlaps the first surface of the first adhesive layer.

11. The apparatus of claim 10, wherein the mask directly contacts the first surface of the first adhesive layer.

12. The apparatus of claim 1, wherein the mask is disposed within the film layer.

13. The apparatus of claim 12, wherein
the film layer comprises:
- cover layers; and
- at least one adhesive layer between some of the cover layers,
- a first cover layer among the cover layers comprises a first opening to the cavity and exposes a portion of a first adhesive layer among the at least one adhesive layer, the portion of the first adhesive layer being arranged and configured to detachably couple with the panel assembly, and
- a second cover layer among the cover layers comprises at least one second opening, the mask being at least partially supported in the at least one second opening.

14. The apparatus of claim 13, wherein, in the view the periphery of the cavity overlaps a portion of the mask.

15. The apparatus of claim 13, wherein
both the mask and the second cover layer have an ultraviolet light transmittance of about 40% or more, and
the first an adhesive layer comprises a photoinitiator that reacts to an ultraviolet ray.

16. The apparatus of claim 2, wherein the cavity extends in the second direction between inner surfaces of both the mask and the film layer in the third direction.

17. An apparatus, comprising:
- a seating portion configured to support a panel assembly;
- a jig configured to support a window; and
- a guide film between the jig and the seating portion, wherein
the guide film comprises:
- a film layer comprising a region configured to support the panel assembly; and
- a mask disposed on the film layer and spaced apart from the region, and
- a hardness of the mask is greater than a hardness of the film layer.

18. A method of manufacturing a display device, the method comprising:
- preparing a window for bonding with a panel assembly;
- preparing a guide film comprising the panel assembly disposed on a surface of the guide film, the guide film further comprising a mask spaced apart from the panel assembly; and
- causing, at least in part, relative displacement between the window and the guide film to bond the window and the panel assembly to each other,
- wherein the relative displacement causes a first portion of the window to contact a first portion of the panel assembly prior to at least one second portion of the window contacting at least one second portion of the panel assembly, the at least one second portion of the panel assembly being closer to an edge of the panel assembly than the first portion of the panel assembly.

19. The method of claim 18, wherein the relative displacement causes at least one third portion of the window to come into contact with the mask prior to the at least one second portion of the panel assembly coming into contact with the window.

20. The method of claim 18, wherein
the at least one second portion of the panel assembly is supported by the mask, and
the method further comprises controlling bending of the at least one second portion of the panel assembly.

* * * * *